(12) United States Patent
Lee et al.

(10) Patent No.: US 12,354,943 B2
(45) Date of Patent: Jul. 8, 2025

(54) SEMICONDUCTOR DEVICE

(71) Applicant: SAMSUNG ELECTRONICS CO., LTD., Suwon-si (KR)

(72) Inventors: Eui Bok Lee, Seoul (KR); Rakhwan Kim, Suwon-si (KR); Wandon Kim, Seongnam-si (KR); Seowoo Nam, Seoul (KR); Sunyoung Noh, Hwaseong-si (KR); Ki Chul Park, Suwon-si (KR); Jongchan Shin, Gwacheon-si (KR); Minjoo Lee, Seoul (KR); Hyunbae Lee, Seoul (KR); Seungseok Ha, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1044 days.

(21) Appl. No.: 17/344,670

(22) Filed: Jun. 10, 2021

(65) Prior Publication Data
US 2022/0208673 A1    Jun. 30, 2022

(30) Foreign Application Priority Data

Dec. 24, 2020 (KR) .................. 10-2020-0183299

(51) Int. Cl.
*H01L 23/522* (2006.01)
*H01L 27/088* (2006.01)
(Continued)

(52) U.S. Cl.
CPC ..... *H01L 23/5226* (2013.01); *H10D 30/6211* (2025.01); *H10D 30/6219* (2025.01); *H10D 30/797* (2025.01); *H10D 84/834* (2025.01)

(58) Field of Classification Search
CPC ....... H01L 21/76877; H01L 21/823431; H01L 21/823821; H01L 21/845; H01L 23/5226; H01L 23/528; H01L 23/5283; H01L 27/0886; H01L 27/0924; H01L 27/1211; H01L 29/41791; H01L 29/66795; H01L 29/7848; H01L 29/785; H01L 29/7851;
(Continued)

(56) References Cited

U.S. PATENT DOCUMENTS 8,652,962 B2   2/2014  Singh et al.
9,318,377 B2   4/2016  Singh et al.
(Continued)

FOREIGN PATENT DOCUMENTS

KR   10-2016-0136715 A   11/2016

*Primary Examiner* — David C Spalla
(74) *Attorney, Agent, or Firm* — Finnegan, Henderson, Farabow, Garrett & Dunner, LLP

(57) ABSTRACT

Disclosed is a semiconductor device including a substrate, a first interlayer dielectric layer on the substrate, a plurality of first vias in the first interlayer dielectric layer, a second interlayer dielectric layer on the first interlayer dielectric layer, and a first power line and a first lower line in the second interlayer dielectric layer that are electrically connected to respective ones of the first vias. A first width in a first direction of the first power line is greater than a second width in the first direction of the first lower line. The first power line includes a first metallic material. The first lower line includes a second metallic material. The first vias includes a third metallic material. The first, second, and third metallic materials are different from each other.

19 Claims, 43 Drawing Sheets

(51) Int. Cl.
*H01L 29/417* (2006.01)
*H01L 29/78* (2006.01)
*H10D 30/62* (2025.01)
*H10D 30/69* (2025.01)
*H10D 84/83* (2025.01)

(58) Field of Classification Search
CPC ............ H01L 29/7853; H01L 29/7855; H01L 2029/7858; H10D 30/024; H10D 30/62; H10D 30/6211; H10D 30/6212; H10D 30/6219; H10D 30/6713; H10D 30/797; H10D 62/021; H10D 62/149; H10D 62/151; H10D 84/013; H10D 84/017; H10D 84/0158; H10D 84/0193; H10D 84/834; H10D 84/853
See application file for complete search history.

(56) References Cited

U.S. PATENT DOCUMENTS

| | | | |
|---|---|---|---|
| 9,786,549 B2 | 10/2017 | Singh et al. | |
| 10,312,136 B2 | 6/2019 | Singh et al. | |
| 10,347,710 B2 | 7/2019 | Verma et al. | |
| 10,510,688 B2 | 12/2019 | Sio et al. | |
| 2002/0084530 A1* | 7/2002 | Park | H01L 23/5222 |
| | | | 257/E23.152 |
| 2008/0157380 A1 | 7/2008 | Hong | |
| 2015/0357282 A1* | 12/2015 | Lau | H01L 27/088 |
| | | | 257/774 |
| 2016/0343708 A1 | 11/2016 | Park et al. | |
| 2018/0053721 A1* | 2/2018 | Adusumilli | H01L 23/53266 |
| 2018/0158828 A1 | 6/2018 | Han et al. | |
| 2018/0358293 A1* | 12/2018 | Hong | H01L 21/76808 |
| 2019/0279896 A1 | 9/2019 | Singh et al. | |
| 2020/0083428 A1 | 3/2020 | Weng et al. | |
| 2020/0185271 A1 | 6/2020 | Wallace et al. | |
| 2020/0243374 A1 | 7/2020 | Choi et al. | |
| 2022/0165617 A1* | 5/2022 | Luo | H01L 21/76877 |
| 2022/0367265 A1* | 11/2022 | Hsieh | H01L 21/76862 |

* cited by examiner

SEMICONDUCTOR DEVICE

CROSS-REFERENCE TO RELATED APPLICATION

This U.S. nonprovisional application claims priority under 35 U.S.C § 119 to Korean Patent Application No. 10-2020-0183299 filed on Dec. 24, 2020 in the Korean Intellectual Property Office, the disclosure of which is hereby incorporated by reference in its entirety.

BACKGROUND

The present inventive concepts relate to a semiconductor device, and more particularly, to a semiconductor device including a field effect transistor.

A semiconductor device includes an integrated circuit including metal oxide semiconductor field effect transistors (MOSFETs). As sizes and design rules of the semiconductor device are gradually decreased, sizes of the MOSFETs may be scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some embodiments of the present inventive concepts provide a semiconductor device with improved electrical characteristics.

According to some embodiments of the present inventive concepts, a semiconductor device may include a plurality of transistors on a substrate, a first interlayer dielectric layer on the transistors, a plurality of first vias in the first interlayer dielectric layer, a second interlayer dielectric layer on the first interlayer dielectric layer, and a first power line and a first lower line in the second interlayer dielectric layer that are electrically connected to respective ones of the first vias. A first width in a first direction of the first power line may be greater than a second width in the first direction of the first lower line. The first power line may include a first metallic material. The first lower line may include a second metallic material. The first vias may include a third metallic material. The first, second, and third metallic materials may be different from each other.

According to some embodiments of the present inventive concepts, a semiconductor device may include a plurality of transistors on a substrate, a first interlayer dielectric layer on the transistors, a plurality of first vias in the first interlayer dielectric layer, a second interlayer dielectric layer on the first interlayer dielectric layer, and a first power line and a first lower line in the second interlayer dielectric layer that are electrically connected to respective ones of the first vias. A minimum width in a first direction of the first power line may be greater than a minimum width in the first direction of the first lower line. A width at a top surface of the first power line may be greater than a width at a bottom surface of the first power line. A width at a top surface of the first lower line may be less than a width at a bottom surface of the first lower line.

According to some embodiments of the present inventive concepts, a semiconductor device may include a substrate that includes an active region, a device isolation layer that defines a plurality of active patterns on the active region, wherein the device isolation layer is on a lower sidewall of each of the active patterns, and wherein an upper portion of each of the active patterns protrudes upward from the device isolation layer, a pair of source/drain patterns on an upper portion of each of the active patterns, a channel pattern between the pair of source/drain patterns, a gate electrode on the channel pattern and extends in a first direction, a gate spacer on a side of the gate electrode, the gate spacer extending in the first direction along the gate electrode, a gate dielectric layer between the gate electrode and the channel pattern and between the gate electrode and the gate spacer, a gate capping pattern on a top surface of the gate electrode, the gate capping pattern extending in the first direction along the gate electrode, a first interlayer dielectric layer on the gate capping pattern, an active contact that penetrates the first interlayer dielectric layer and has electrical connection with at least one source/drain pattern, a second interlayer dielectric layer on the first interlayer dielectric layer, a plurality of first vias in the second interlayer dielectric layer, a first etch stop layer on the second interlayer dielectric layer, a third interlayer dielectric layer on the first etch stop layer, and a first power line and a first lower line in the third interlayer dielectric layer that are electrically connected to respective ones of the first vias. A first width in a first direction of the first power line may be greater than a second width in the first direction of the first lower line. The first power line may include a first metallic material. The first lower line may include a second metallic material. The first vias may include a third metallic material. The first, second, and third metallic materials may be different from each other.

DETAILED DESCRIPTION

Figure 1:
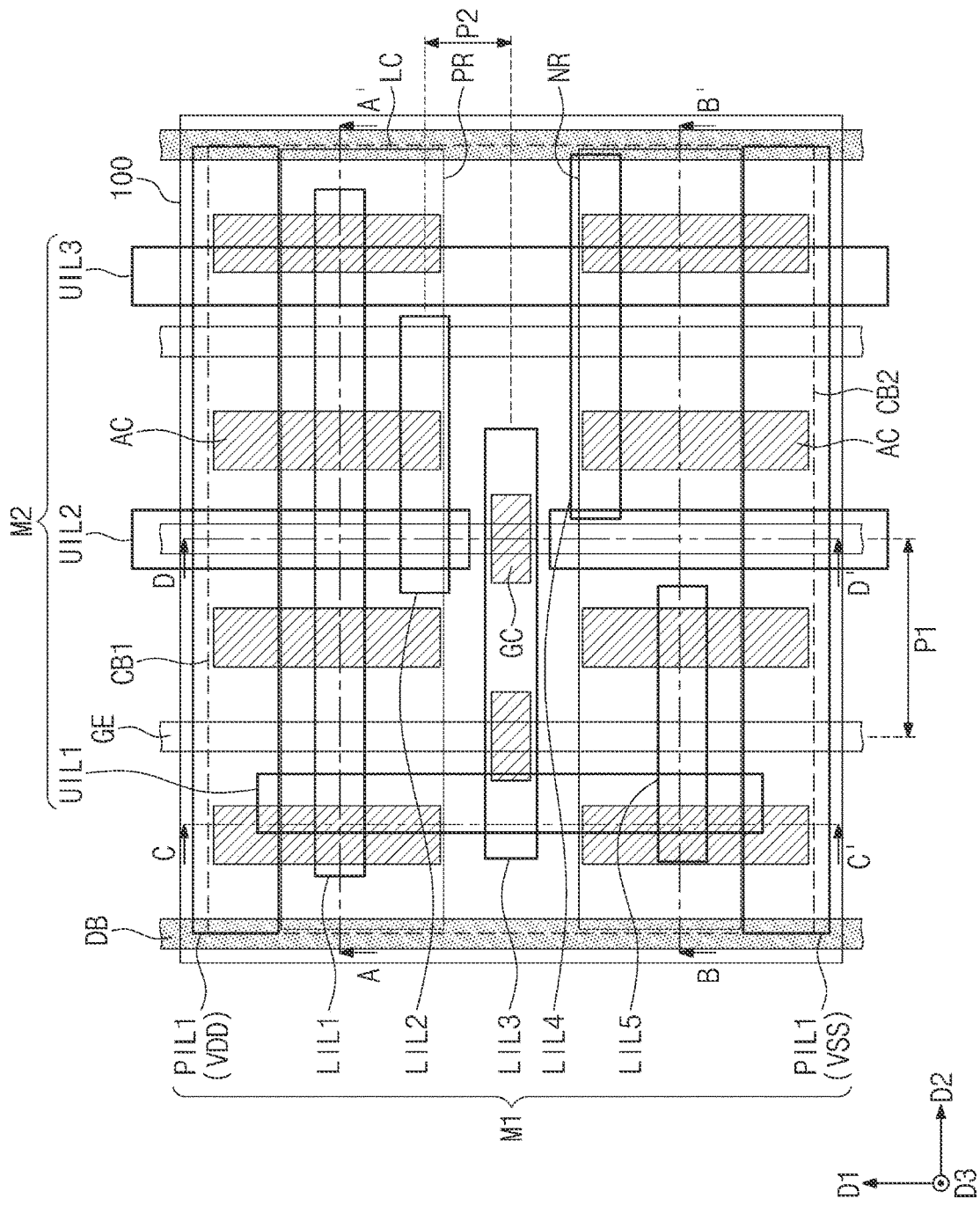
FIG. 1 illustrates a plan view showing a semiconductor device according to some embodiments of the present inventive concepts.

FIG. 1 illustrates a plan view showing a semiconductor device according to some embodiments of the present inventive concepts. FIGS. 2A, 2B, 2C, and 2D illustrate cross-sectional views respectively taken along lines A-A', B-B', C-C', and D-D' of FIG. 1.

Referring to FIGS. 1, 2A, 2B, 2C, and 2D, a logic cell LC may be provided on a substrate 100. In this description, the language "logic cell" may mean a logic device (e.g., inverter, flip-flop, etc.) that performs one or more specific functions. For example, the logic cell LC may include transistors that constitute a logic device and wiring lines that connect the transistors to each other.

The substrate 100 may include a first active region PR and a second active region NR. As an example embodiment of the present inventive concepts, the first active region PR may be a PMOSFET area, and the second active region NR may be an NMOSFET area. The substrate 100 may be a compound semiconductor substrate or a semiconductor substrate including silicon, germanium, or silicon-germanium. For example, the substrate 100 may be a silicon substrate.

The first active region PR and the second active region NR may be defined by a second trench TR2 formed on an upper portion of the substrate 100. A second trench TR2 may be positioned between the first active region PR and the second active region NR. The first active region PR and the second active region NR may be spaced apart from each other in a first direction D1, separated by the second trench TR2. Each of the first and second active regions PR and NR may extend in a second direction D2 that intersects the first direction D1.

First active patterns AP1 and second active patterns AP2 may be respectively provided on the first active region PR and the second active region NR. The first and second active patterns AP1 and AP2 may extend parallel to each other in the second direction D2. The first and second active patterns AP1 and AP2 may be portions of the substrate 100 that protrude in a vertical direction (i.e., a third direction D3). A first trench TR1 may be defined between neighboring first active patterns AP1 and between neighboring second active patterns AP2. The first trench TR1 may be shallower in depth than the second trench TR2.

A device isolation layer ST may at least partially fill or completely fill the first and second trenches TR1 and TR2. The device isolation layer ST may include a silicon oxide layer. The first and second active patterns AP1 and AP2 may have upper portions that protrude vertically upwards from the device isolation layer ST (see FIG. 2D). Each of the first and second active patterns AP1 and AP2 may have a fin shape at the upper portion thereof. The device isolation layer ST may not cover or may not overlap the upper portions of the first and second active patterns AP1 and AP2. The device isolation layer ST may cover or overlap lower sidewalls of the first and second active patterns AP1 and AP2. The device isolation layer ST may be in contact with lower sidewalls of the first and second active patterns AP1 and AP2.

First source/drain patterns SD1 may be provided on the upper portions of the first active patterns AP1. The first source/drain patterns SD1 may be impurity regions having a first conductivity type (e.g., p-type). A first channel pattern CH1 may be interposed between a pair of first source/drain patterns SD1. Second source/drain patterns SD2 may be provided on the upper portions of the second active patterns AP2. The second source/drain patterns SD2 may be impurity regions having a second conductivity type (e.g., n-type). A second channel pattern CH2 may be interposed between a pair of second source/drain patterns SD2.

The first and second source/drain patterns SD1 and SD2 may be epitaxial patterns formed by a selective epitaxial growth process. For example, the first and second source/drain patterns SD1 and SD2 may have their top surfaces coplanar with those of the first and second channel patterns CH1 and CH2. For another example, the first and second source/drain patterns SD1 and SD2 may have their top surfaces higher than those of the first and second channel patterns CH1 and CH2.

The first source/drain patterns SD1 may include a semiconductor element (e.g., SiGe) whose lattice constant is greater than that of a semiconductor element of the substrate 100. Therefore, the first source/drain patterns SD1 may provide the first channel patterns CH1 with compressive stresses. In other words, the lattice constants of the first source/drain patterns SD1 may be greater than a lattice constant of the substrate such that the first source/drain patterns SD1 exert a compressive stress on a channel pattern therebetween. For example, the second source/drain patterns SD2 may include the same semiconductor element (e.g., Si) as that of the substrate 100.

Gate electrodes GE may be provided to extend in the first direction D1, while crossing the first and second active patterns AP1 and AP2. The gate electrodes GE may be arranged at a first pitch P1 along the second direction D2. The gate electrodes GE may vertically overlap the first and second channel patterns CH1 and CH2. Each of the gate electrode GE may surround a top surface and opposite sidewall and opposite sidewalls of each of the first and second channel patterns CH1 and CH2.

Referring back to FIG. 2D, the gate electrode GE may be on a first top surface TS1 of the first channel pattern CH1 and on at least one first sidewall SW1 of the first channel pattern CH1. The gate electrode GE may be on a second top surface TS2 of the second channel pattern CH2 and on at least one second sidewall SW2 of the second channel pattern CH2. For example, a transistor according to some embodiments may be a three-dimensional field effect transistor (e.g., FinFET) in which the gate electrode GE three-dimensionally surrounds the first and second channel patterns CH1 and CH2.

Referring back to FIGS. 1, 2A, 2B, 2C, and 2d, a pair of gate spacers GS may be disposed on opposite sidewalls of each of the gate electrodes GE. The gate spacers GS may extend in the first direction D1 along the gate electrodes GE. The gate spacers GS may have their top surfaces higher than those of the gate electrodes GE. The top surfaces of the gate spacers GS may be coplanar with that of a first interlayer dielectric layer 110 which will be discussed below. The gate spacers GS may include at least one selected from SiCN, SiCON, and SiN. In some embodiments, the gate spacers GS may each include a multi-layer formed of at least two selected from SiCN, SiCON, and SiN.

A gate capping pattern GP may be provided on each of the gate electrodes GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric layer GI may be interposed between the gate electrode GE and the first active pattern AP1 and between the gate electrode GE and the second active pattern AP2. The gate dielectric layer GI may extend along a bottom surface of the gate electrode GE that overlies the gate dielectric layer GI. For example, the gate dielectric layer GI may cover or overlap the first top surface TS1 and the first sidewall SW1 of the first channel pattern CH1. The gate dielectric layer GI may cover or overlap the second top surface TS2 and the second sidewall SW2 of the second channel pattern CH2. The gate dielectric layer GI may cover or overlap a top surface of the device isolation layer ST that underlies the gate electrode GE (see FIG. 2D).

In some embodiments of the present inventive concepts, the gate dielectric layer GI may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

In some embodiments, a semiconductor device according to the present inventive concepts may include a negative capacitance field effect transistor that uses a negative capacitor. For example, the gate dielectric layer GI may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and/or lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped thereinto. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). A kind of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and/or yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities include silicon (Si), the ferroelectric material layer may include about 2 to 10 at % silicon. When the impurities include yttrium (Y), the ferroelectric material layer may include about 2 to 10 atomic percent yttrium. When the impurities include gadolinium (Gd), the ferroelectric material layer may include about 1 to 7 atomic percent gadolinium. When the impurities include zirconium (Zr), the ferroelectric material layer may include about 50 to 80 atomic percent zirconium.

The paraelectric material layer may have paraelectric properties. The paraelectric material layer may include, for example, at least one selected from silicon oxide and/or high-k metal oxide. The metal oxide included in the paraelectric material layer may include, for example, at least one selected from hafnium oxide, zirconium oxide, and/or aluminum oxide, but the present inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a different crystal structure from that of the hafnium oxide included in the paraelectric material layer.

The ferroelectric material layer may have a thickness having ferroelectric properties. The thickness of the ferroelectric material layer may range, for example, from about 0.5 nm to about 10 nm, but the present inventive concepts are not limited thereto. Since ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

The gate electrode GE may include a first metal and a second metal on the first metal. The first metal may be on the gate dielectric layer GI and may be adjacent to the first and second channel patterns CH1 and CH2. The first metal may include a work-function metal that controls a threshold voltage of a transistor. A thickness and composition of the first metal may be adjusted to achieve a desired threshold voltage.

The first metal may include metal nitride. For example, the first metal may include nitrogen (N) and at least one metal selected from titanium (Ti), tantalum (Ta), aluminum (Al), tungsten (W), and/or molybdenum (Mo). The first metal may further include carbon (C). The first metal may include a plurality of stacked work-function metal layers.

The second metal may include metal whose resistance is lower than that of the first metal. For example, the second metal may include at least one metal selected from tungsten (W), aluminum (Al), titanium (Ti), and tantalum (Ta).

A first interlayer dielectric layer 110 may be provided on the substrate 100. The first interlayer dielectric layer 110 may cover or overlap the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 that covers or overlaps the gate capping patterns GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

Referring again to FIG. 1, the logic cell LC may have opposite sides that face each other in the second direction D2, and a pair of separation structures DB may be provided on the opposite sides of the logic cell LC. The separation structure DB may extend in the first direction D1 parallel to the gate electrodes GE. The separation structure DB and its adjacent gate electrode GE may be arranged at a first pitch P1.

The separation structure DB may penetrate the first and second interlayer dielectric layers 110 and 120, and may extend into the first and second active patterns AP1 and AP2. The separation structure DB may penetrate the upper portion of each of the first and second active patterns AP1 and AP2. The separation structure DB may separate the first and second active regions PR and NR of the logic cell LC from an active region of an adjacent logic cell.

Active contacts AC may be provided to penetrate the first and second interlayer dielectric layers 110 and 120 and to correspondingly have electrical connection with the first and second source/drain patterns SD1 and SD2. Each of the active contacts AC may be provided between a pair of gate electrodes GE.

The active contact AC may be a self-aligned contact. For example, the gate capping pattern GP and the gate spacer GS may be used to form the active contact AC in a self-aligned manner. For example, the active contact AC may cover or overlap at least a portion of a sidewall of the gate spacer GS. Although not shown, the active contact AC may partially cover or partially overlap a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, for example, at least one selected from titanium silicide, tantalum silicide, tungsten silicide, nickel silicide, and/or cobalt silicide.

A gate contact GC may be provided to penetrate the second interlayer dielectric layer 120 and the gate capping pattern GP and to have connection with the gate electrode GE. When viewed in plan, the gate contact GC may be disposed between the first active region PR and the second active region NR. The gate contact GC may have a bottom surface in contact with the top surface of the gate electrode GE. The gate contact GC may have a top surface coplanar with that of the second interlayer dielectric layer 120.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and/or cobalt. The barrier pattern BM may cover or overlap sidewalls and a bottom surface of the conductive pattern FM. The barrier pattern BM may include a metal layer and a metal nitride layer. The metal layer may include at least one selected from titanium, tantalum, tungsten, nickel, cobalt, and/or platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and/or a platinum nitride (PtN) layer.

A first wiring layer M1 may be provided on the second interlayer dielectric layer 120. A second wiring layer M2 may be provided on the first wiring layer M1. The first and second wiring layers M1 and M2 will be further discussed in detail below with reference to FIG. 3.

Figure 2A:
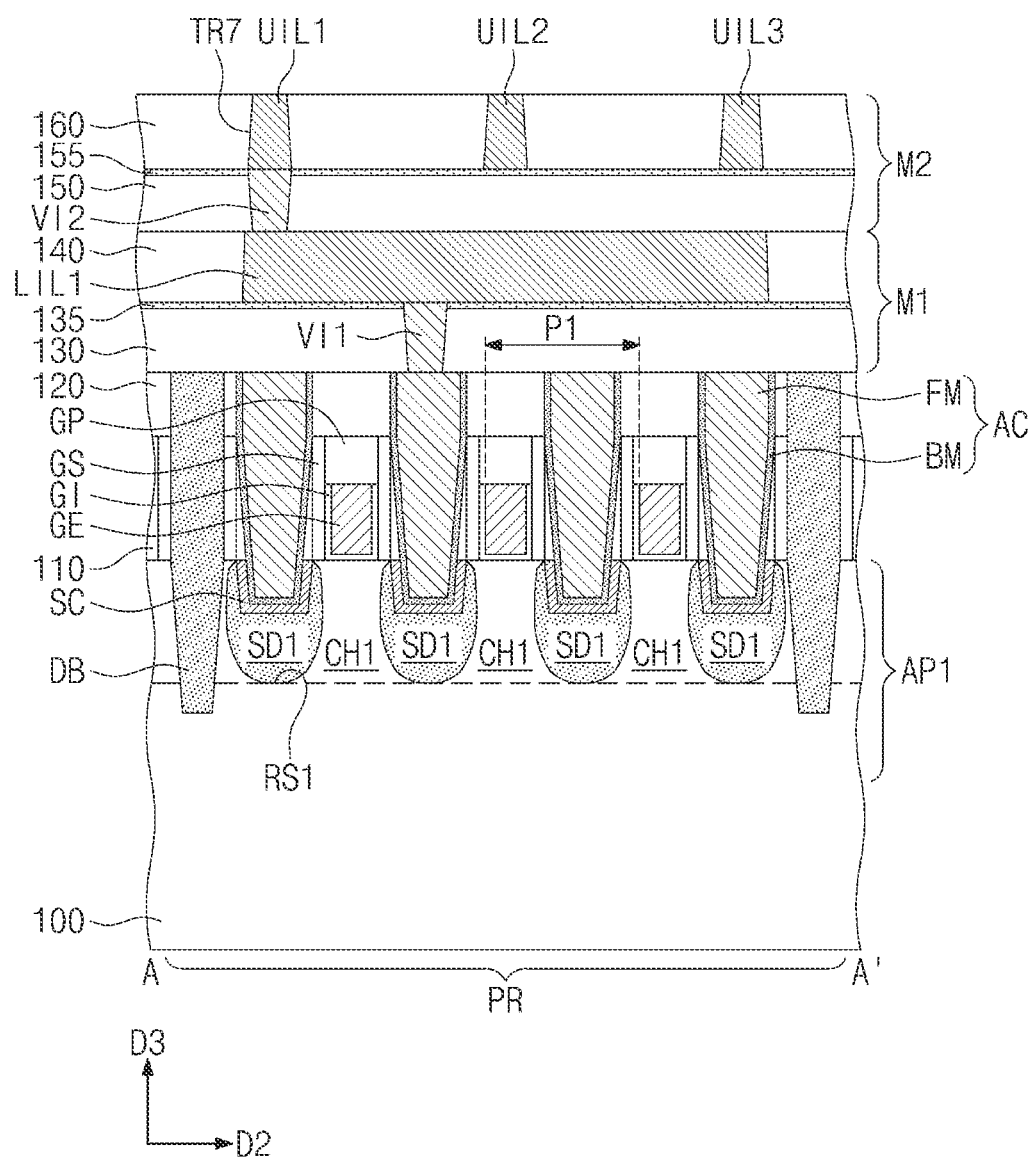
FIGS. 2A, 2B, 2C, and 2D illustrate cross-sectional views respectively taken along lines A-A', B-B', C-C', and D-D' of FIG. 1.
Figure 2B:
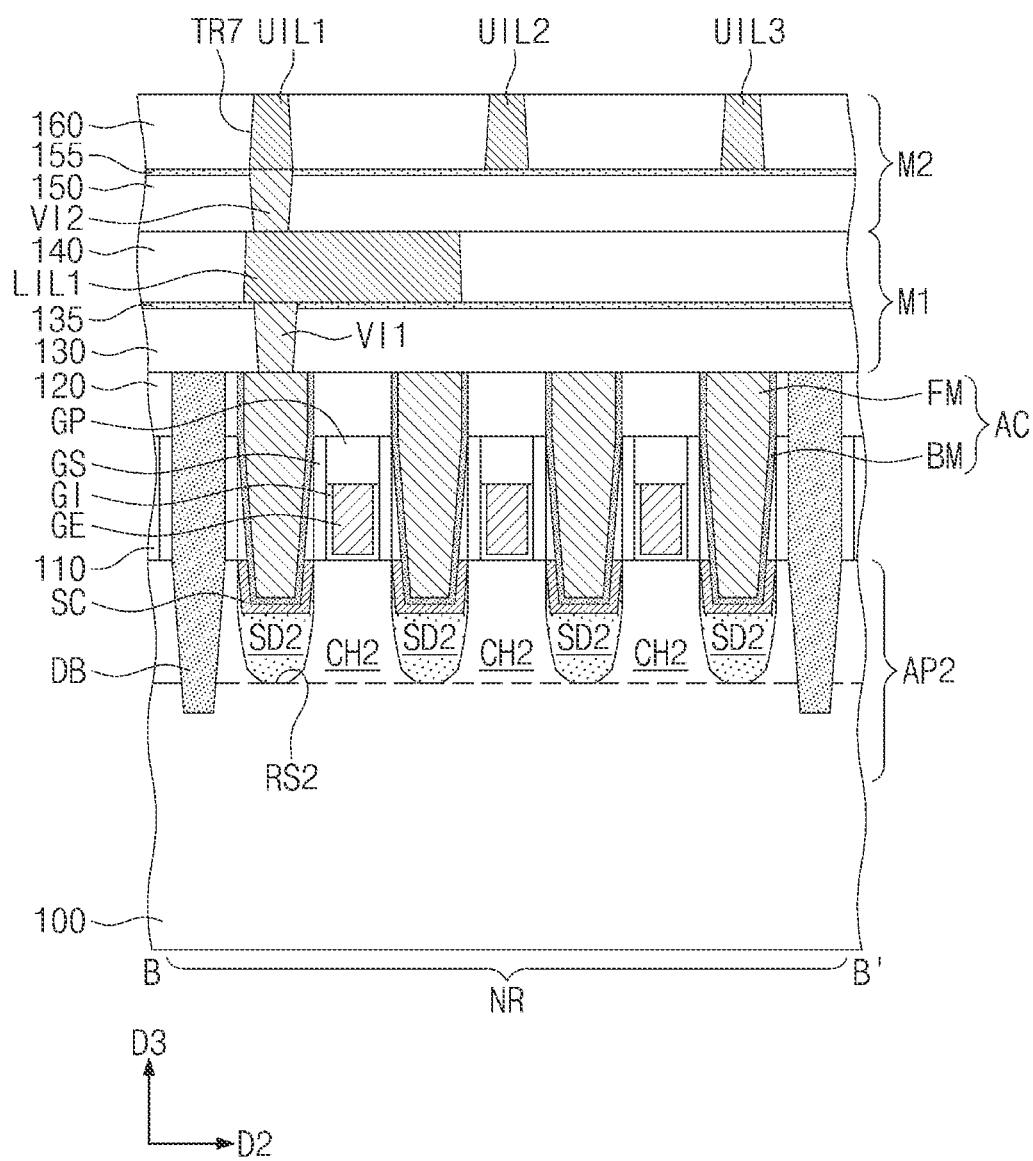
Figure 2C:
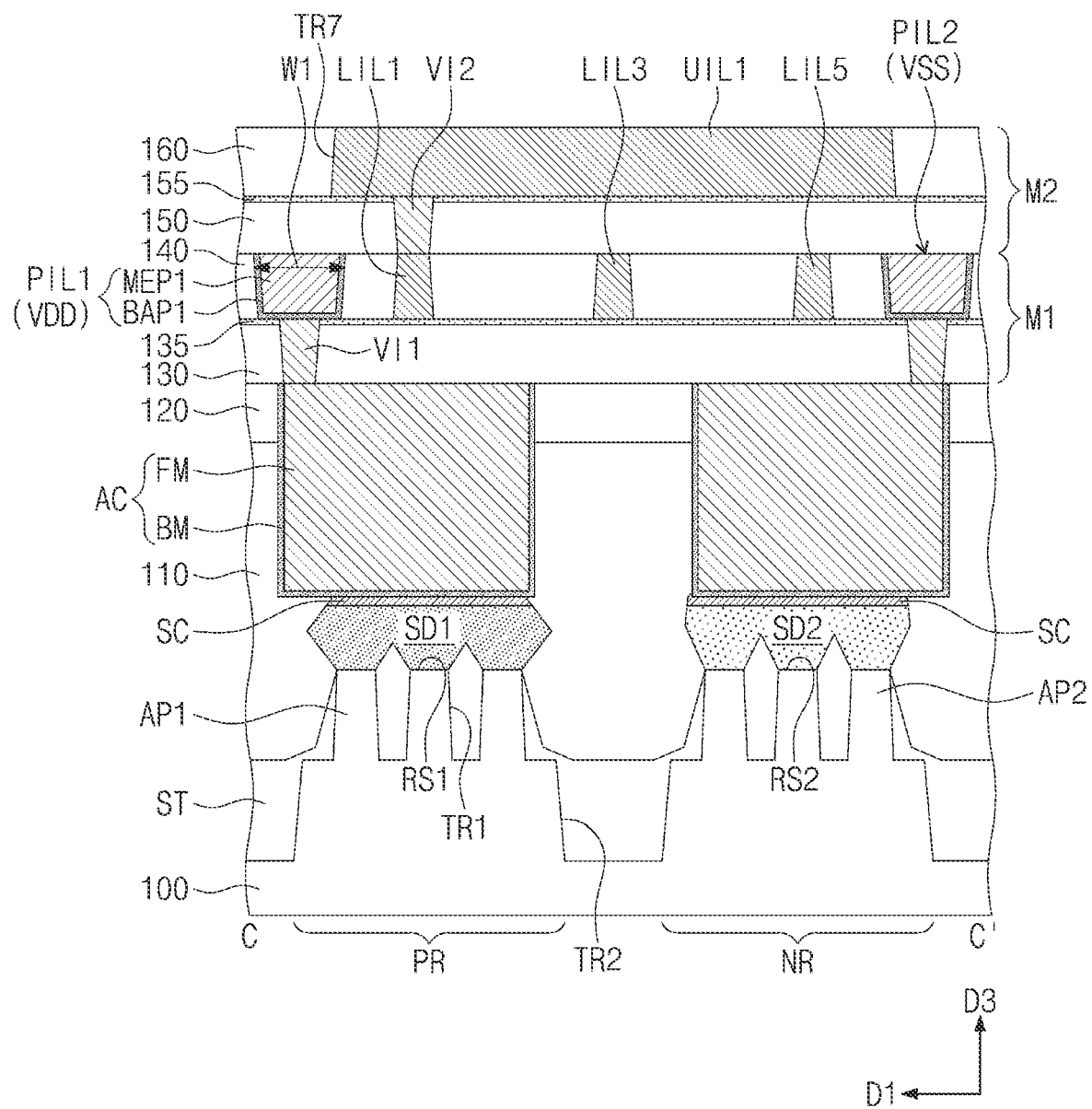
Figure 2D:
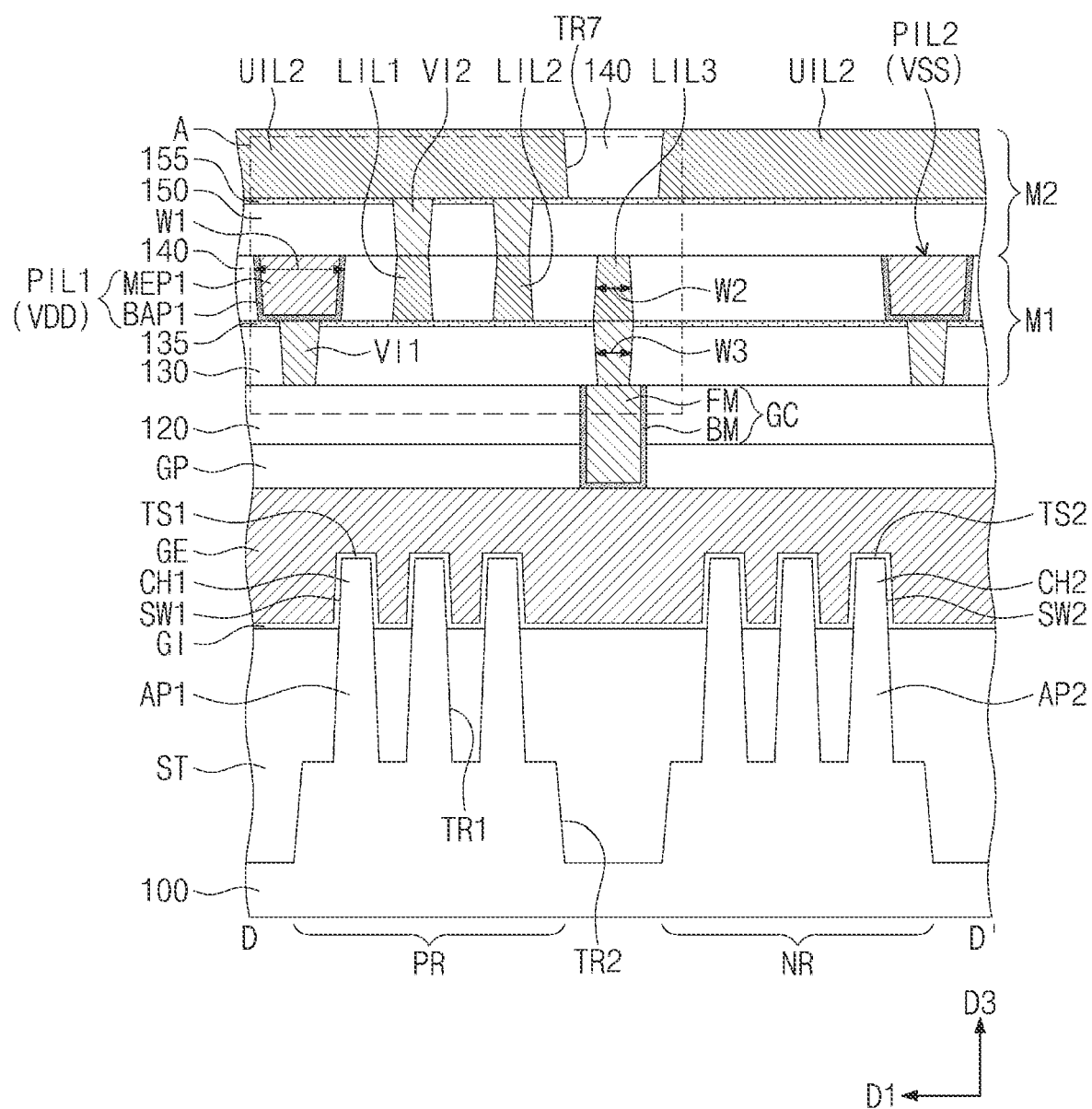
Figure 3:
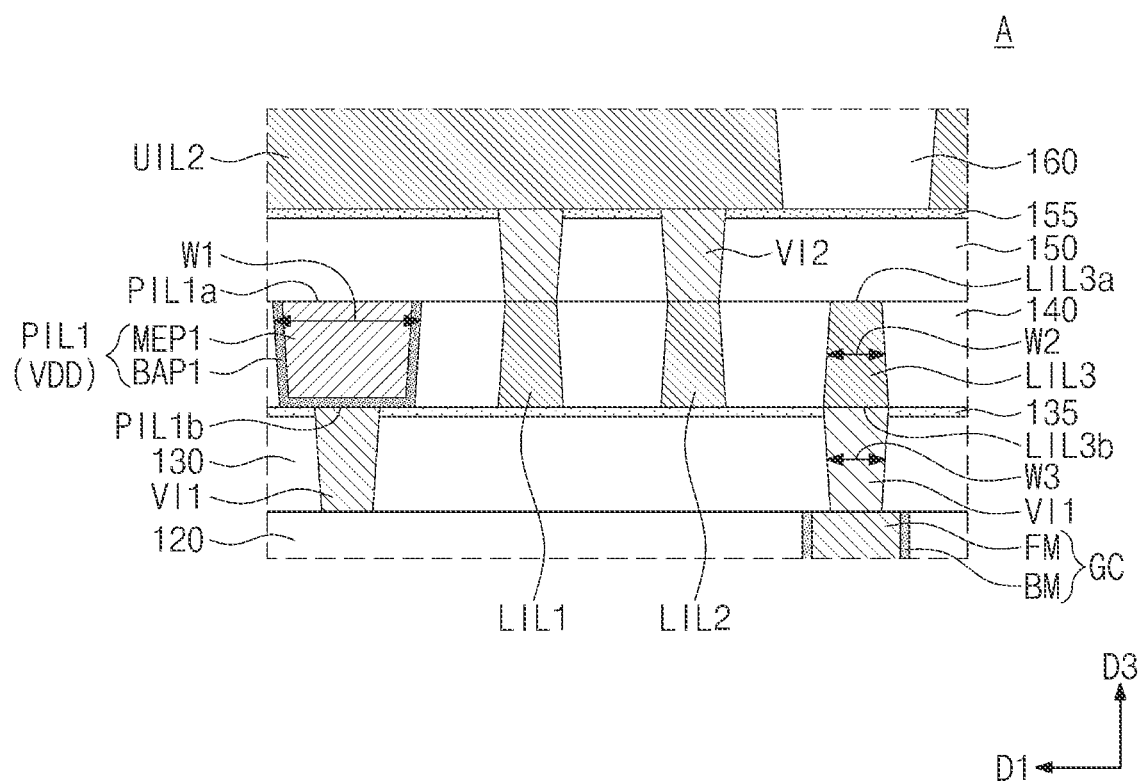
FIG. 3 illustrates an enlarged view showing section A of FIG. 2D.

FIG. 3 illustrates an enlarged view showing section A of FIG. 2D. The following will omit the repetitive description, and the first and second wiring layers will be discussed in detail below.

Referring to FIG. 3 together with FIGS. 1 and 2D, the first wiring layer M1 may include a third interlayer dielectric layer 130, a first etch stop layer 135, a fourth interlayer dielectric layer 140, first and second power lines PIL1 and PIL2, first to fifth lower lines ILI1 to ILL5, and first vias VI1.

The first vias VI1 may be provided in the third interlayer dielectric layer 130. The first vias VI1 may penetrate the third interlayer dielectric layer 130 and the first etch stop layer 135. The first vias VI1 may be interposed between the active contacts AC and the first and second power line PIL1 and PIL2. The first vias VI1 may be interposed between the first to fifth lower lines LIL1 to LIL5 and the active and gate contacts AC and GC. Each of the first vias VI1 may have a lateral surface in direct contact with the third interlayer dielectric layer 130. The first vias VI1 may include a material different from that of the first and second power lines PIL1 and PIL2 and that of the first to fifth lower lines LIL1 to LIL5. For example, the first vias VI1 may include a metallic material, such as ruthenium (Ru), molybdenum (Mo), cobalt (Co), or tungsten (W).

Each of the first vias VI1 may have a width W3 in the first direction D1 that increases with decreasing distance from a top surface of the third interlayer dielectric layer 130. A range of about 1 nm to about 20 nm may be given as the width W3 in the first direction D1 of each of the first vias VI1. The width W3 in the first direction D1 at a top surface of each of the first vias VI1 may be greater than the width W3 in the first direction D1 at a bottom surface of each of the first vias VI1. Each of the first vias VI1 may have a pair of lateral surfaces which face each other and each of which has a tapered shape with respect to the top surface (or bottom surface) of the third interlayer dielectric layer 130.

The first etch stop layer 135 may be provided on the third interlayer dielectric layer 130. The first etch stop layer 135 may cover or overlap the top surface of the third interlayer dielectric layer 130, but may not cover or may not overlap the top surfaces of the first vias VI1. The first etch stop layer 135 may include a metal oxide layer or a metal nitride layer. The metal oxide layer or the metal nitride layer may contain at least one metal selected from Al, Zr, Y, Hf, and/or Mo. For example, the first etch stop layer 135 may include aluminum oxide, hafnium oxide, hafnium zirconium oxide, aluminum nitride, hafnium nitride, or hafnium zirconium nitride.

Referring to FIGS. 1 and 2D, the first and second power lines PIL1 and PIL2 may be provided in the fourth interlayer dielectric layer 140. Referring to FIG. 1, the first and second power lines PIL1 and PIL2 may parallel extend in the second direction D2 while running across the logic cell LC. The first power line PIL1 and the second power line PIL2 may be supplied with power voltages, for example, a drain voltage VDD and a source voltage VSS, respectively.

As shown in FIG. 1, the logic cell LC may include a first cell boundary CB1 that extends in the second direction D2. On the logic cell LC, a second cell boundary CB2 may be defined on a location opposite to that on which the first cell boundary CB1 is defined. The first cell boundary CB1 may be provided thereon with the first power line PIL1 to which the drain voltage VDD is applied. For example, the first power line PIL1 to which the drain voltage VDD is applied may extend in the second direction D2 along the first cell boundary CB1. The second cell boundary CB2 may be provided thereon with the second power line PIL2 to which is applied the source voltage VSS or ground voltage. For example, the second power line PIL2 to which the source voltage VSS is applied may extend in the second direction D2 along the second cell boundary CB2.

Each of the first and second power lines PIL1 and PIL2 may include a first barrier metal pattern BAP1 and a first metal pattern MEP1 on the first barrier metal pattern BAP1. The first barrier metal pattern BAP1 may have a letter U shape. The first barrier metal pattern BAP1 may have a top surface at substantially the same level as that of a top surface of the fourth interlayer dielectric layer 140. The first barrier metal pattern BAP1 may directly contact the fourth interlayer dielectric layer 140.

The first barrier metal pattern BAP1 may increase adhesion between the first metal pattern MEP1 and the fourth interlayer dielectric layer 140. The first barrier metal pattern BAP1 may serve as a barrier that prevents metallic components from diffusing from the first metal pattern MEP1 into the fourth interlayer dielectric layer 140. The first barrier metal pattern BAP1 may include at least one selected from a tantalum nitride (TaN) layer, a titanium nitride (TiN) layer, a tantalum oxide (TaO) layer, a titanium oxide (TiO) layer, a manganese nitride (MnN) layer, and/or a manganese oxide (MnO) layer.

The first barrier metal pattern BAP1 may be provided on the first metal pattern MEP1. The first barrier metal pattern BAP1 may cover or be on a bottom surface and opposite sidewalls of the first metal pattern MEP1. The first metal pattern MEP1 may have a top surface at a level substantially the same as or lower than that that of the top surface of the fourth interlayer dielectric layer 140. Although not shown, the first metal pattern MEP1 may have a convex top surface.

The first metal pattern MEP1 may have a volume greater than that of the first barrier metal pattern BAP1. The first metal pattern MEP1 may include a material different from that of the first vias VI1 and that of the first to fifth lower lines LIL1 to LIL5. The first metal pattern MEP1 may include, for example, copper (Cu), ruthenium (Ru), cobalt (Co), tungsten (W), or molybdenum (Mo).

Each of the first and second power lines PIL1 and PIL2 may have a width W1 in the first direction D1 greater than the width W3 in the first direction D1 of each of the first vias VI1 and a width W2 in the first direction D1 of each of the first to fifth lower lines LIL1 to LIL5. The width W1 in the first direction D1 of each of the first and second power lines PIL1 and PIL2 may increase with decreasing distance from the top surface of the fourth interlayer dielectric layer 140. For example, the width W1 in the first direction D1 at a top surface PIL1a of the first power line PIL1 may be greater than the width W1 in the first direction D1 at a bottom surface PIL1b of the first power line PIL1. A range of about 20 nm to about 100 nm may be given as the width W1 in the first direction D1 of each of the first and second power lines PIL1 and PIL2. Each of the first and second power lines PIL1 and PIL2 may have a pair of lateral surfaces which face each other and each of which has a tapered shape with respect to the top surface (or bottom surface) of the fourth interlayer dielectric layer 140.

The first to fifth lower lines LIL1 to LIL5 may be provided in the fourth interlayer dielectric layer 140. The first to fifth lower lines LIL1 to LIL5 may be interposed between the first vias VI1 and the second vias VI2. Each of the first to fifth lower lines LIL1 to LIL5 may have a lateral surface in direct contact with the fourth interlayer dielectric layer 140. The first to fifth lower lines LIL1 to LIL5 may be disposed between the first power line PIL1 and the second power line PIL2.

As illustrated in FIG. 1, the first to fifth lower lines LIL1 to LIL5 may parallel extend in the second direction D2. When viewed in plan, each of the first to fifth lower lines LIL1 to LIL5 may have a linear or bar shape. The first to fifth lower lines LIL1 to LIL5 may be arranged at a second pitch P2 along the first direction D1. The second pitch P2 may be less than the first pitch P1.

Each of the first to fifth lower lines LIL1 to LIL5 may include a material different from that of the first vias VI1 and that of the first and second power lines PIL1 and PIL2. For example, the first to fifth lower lines LIL1 to LIL5 may include a metallic material, such as ruthenium (Ru), molybdenum (Mo), cobalt (Co), or tungsten (W).

The width W2 in the first direction D1 of each of the first to fifth lower lines LIL1 to LIL5 may decrease with decreasing distance from the top surface of the fourth interlayer dielectric layer 140. For example, a range of about 1 nm to about 20 nm may be given as the width W2 in the first direction D1 of each of the first to fifth lower lines LIL1 to LIL5, For example, the width W2 in the first direction D1 at a top surface LIL3a of one LIL3 among the first to fifth lower lines LIL1 to LIL5 may be less than the width W2 in the first direction D1 at a bottom surface LIL3b of the one LIL3 among the first to fifth lower lines LIL1 to LIL5. Each of the first to fifth lower lines LIL1 to LIL5 may have a pair of lateral surfaces which face each other and each of which has a tapered shape with respect to the top surface (or bottom surface) of the fourth interlayer dielectric layer 140.

According to some embodiments, the first vias VI1, the first to fifth lower lines LIL1 to LIL5, and the first and second power lines PIL1 and PIL2 may each include metallic materials that are different from each other. For example, the first and second power lines PIL1 and PIL2 may include copper (Cu), the first vias VI1 may include molybdenum (Mo), and the first to fifth lower lines LIL1 to LIL5 may include ruthenium (Ru). For another example, the first and second power lines PIL1 and PIL2 may include copper (Cu), the first vias VI1 may include ruthenium (Ru), and the first to fifth lower lines LIL1 to LIL5 may include molybdenum (Mo).

The lower resistivity of metallic materials included in vias and wiring lines, the higher electrical conductivity of vias and the wiring lines. The resistivity may functionally depend on widths of the vias and the wiring lines. Therefore, when vias and wiring lines have their widths different from each other, the vias and the wiring lines may be formed by selecting materials whose resistivity per width is small. According to some embodiments of the present inventive concepts, metallic materials included in vias and lower lines having relatively smaller widths may be different from those included in power lines having relatively larger widths. Therefore, it may be possible to form vias and wiring lines having increased electrical conductivity.

Referring still to FIGS. 1, 2D, and 3, the second wiring layer M2 may be provided on the first wiring layer M1. The second wiring layer M2 may include a fifth interlayer dielectric layer 150, a second etch stop layer 155, a sixth interlayer dielectric layer 160, second vias VI2, and first to third upper lines UIL1 to UIL3.

The fifth interlayer dielectric layer 150 may be provided on the fourth interlayer dielectric layer 140. The second etch stop layer 155 may cover or overlap a top surface of the fifth interlayer dielectric layer 150. The second vias VI2 may be provided in the fifth interlayer dielectric layer 150. The second vias VI2 may penetrate the fifth interlayer dielectric layer 150 and the second etch stop layer 155. The second vias VI2 may be interposed between the first to fifth lower lines LIL1 to LIL5 and the first to third upper lines UIL1 to UIL3. Each of the second vias VI2 may have a lateral surface in direct contact with the fifth interlayer dielectric layer 150. The second vias VI2 may include a material different from that of the first and second power lines PIL1 and PIL2 and that of the first to fifth lower lines LIL1 to LIL5. For example, the second vias VI2 may include a metallic material, such as ruthenium (Ru), molybdenum (Mo), cobalt (Co), or tungsten (W). The second vias VI2 may include a material the same as or different from that of the first vias VI1.

Each of the second vias VI2 may have a width in the first direction D1 that increases with decreasing distance from a top surface of the fifth interlayer dielectric layer 150. A range of about 1 nm to about 20 nm may be given as the width in the first direction D1 of each of the second vias VI2. The width in the first direction D1 at a top surface of each of the second vias VI2 may be greater than that in the first direction D1 at a bottom surface of the each of the second vias VI2. Each of the second vias VI2 may have a pair of lateral surfaces which face each other and each of which has a tapered shape with respect to the top surface (or bottom surface) of the fifth interlayer dielectric layer 150.

The first to third upper lines UIL1 to UIL3 may be provided on the second etch stop layer 155. For example, the first to third upper lines UIL1 to UIL3 may be provided in the sixth interlayer dielectric layer 160. Each of the first to third upper lines UIL1 to UIL3 may have a lateral surface in direct contact with the sixth interlayer dielectric layer 160. The first to third upper lines UIL1 to UIL3 may parallel extend in the first direction D1. When viewed in plan, each of the first to third upper lines UIL1 to UIL3 may have a linear or bar shape. For example, the first to third upper lines UIL1 to UIL3 may be disposed spaced apart from each other along the second direction D2.

The first to third upper lines UIL1 to UIL3 may include a material different from that of the first vias VI1, that of the second vias VI2, and that of the first and second power lines PIL1 and PIL2. For example, the first to third upper lines UIL1 to UIL3 may include a metallic material, such as ruthenium (Ru), molybdenum (Mo), cobalt (Co), or tungsten (W).

Each of the first to third upper lines UIL1 to UIL3 may have a width in the second direction D2 that decreases with decreasing distance from a top surface of the sixth interlayer dielectric layer 160. For example, a range of about 1 nm to about 20 nm may be given as the width in the second direction D2 of each of the first to third upper linens UIL1 to UIL3. For example, the width in the second direction D2 at a top surface of one of the first to third upper lines UIL1 to UIL3 may be less than the width in the second direction D2 at a bottom surface of the one of the firth to third upper lines UIL1 to UIL3. Each of the first to third upper lines UIL1 to UIL3 may have a pair of lateral surfaces which face each other and each of which has a tapered shape with respect to the top surface (or bottom surface) of the sixth interlayer dielectric layer 160.

The first, second, third, fourth, fifth, and sixth interlayer dielectric layers 110, 120, 130, 140, 150, and 160 may include the same dielectric material, and the second etch stop layer 155 may include the same material as that of the first etch stop layer 135.

Figure 2E:
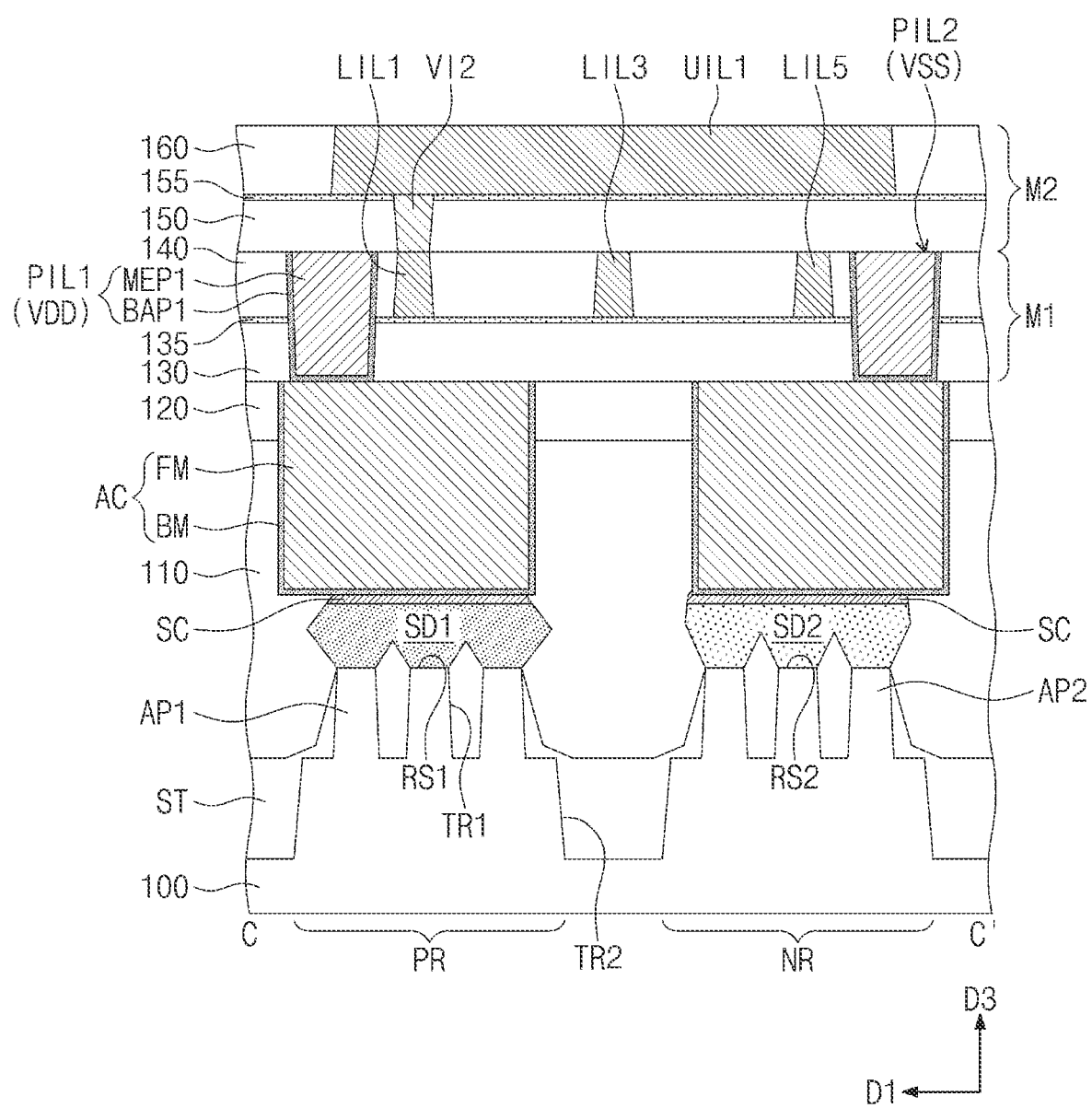
FIGS. 2E and 2F illustrate cross-sectional views respectively taken along lines C-C' and D-D' of FIG. 1, showing a semiconductor device according to some embodiments of the present inventive concepts.
Figure 2F:
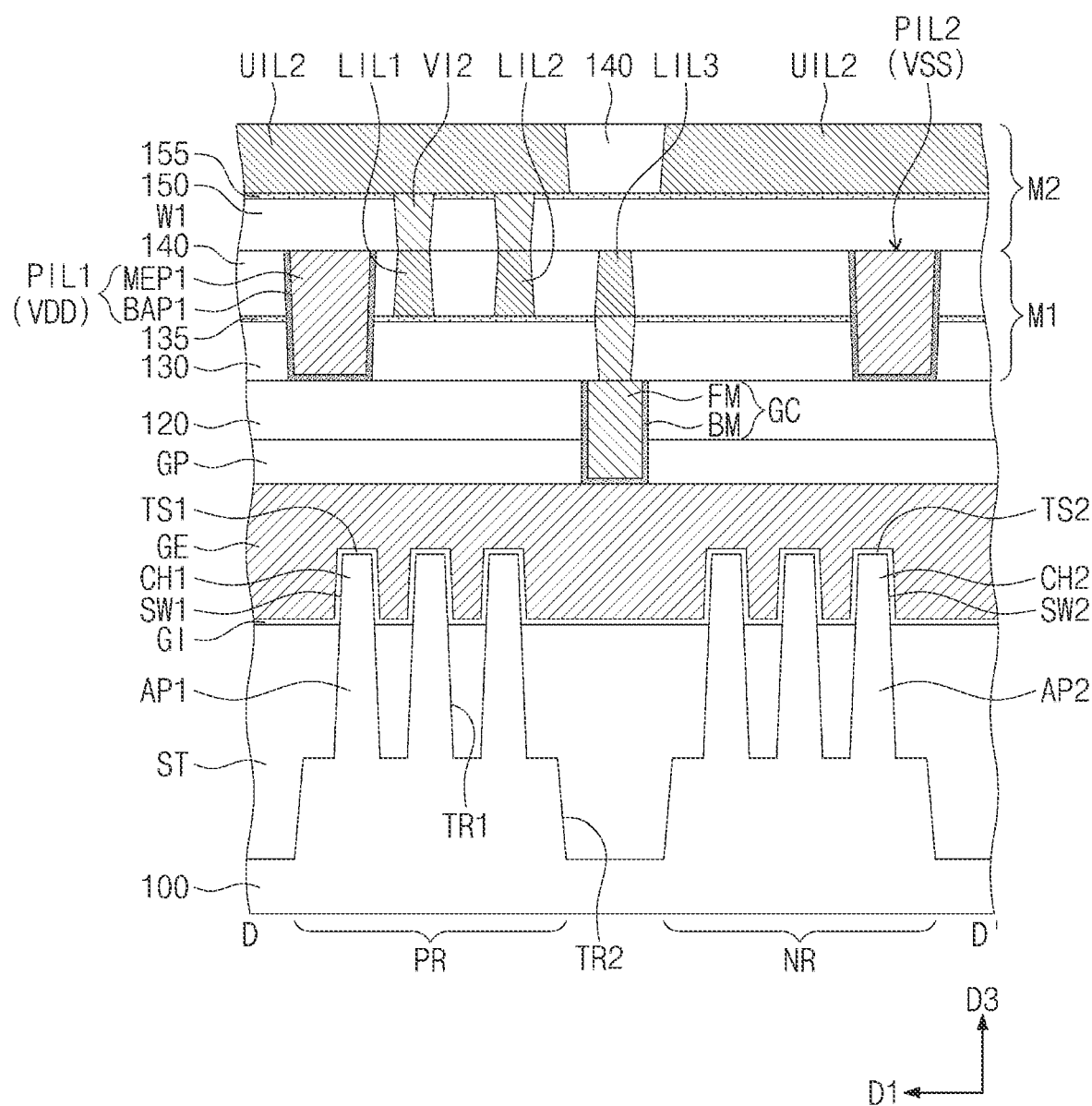

FIGS. 2E and 2F illustrate cross-sectional views respectively taken along lines C-C' and D-D' of FIG. 1, showing a semiconductor device according to some embodiments of the present inventive concepts. In the embodiments that follow, omission will be made to avoid repetitive description of components discussed with reference to FIGS. 1, 2A to 2D, and 3, and differences will be discussed in detail.

Referring to FIGS. 2E and 2F, the first wiring layer M1 may include first and second power lines PIL1 and PIL2. For example, the first and second power lines PIL1 and PIL2 may penetrate the third interlayer dielectric layer 130, the first etch stop layer 135, and the fourth interlayer dielectric layer 140. The first and second power lines PIL1 and PIL2 may have their top surfaces coplanar with that of the fourth interlayer dielectric layer 140, and may have their bottom surfaces in direct contact with corresponding active contacts AC.

Each of the first and second power lines PIL1 and PIL2 may include a first barrier metal pattern BAP1 and a first metal pattern MEP1 on the first barrier metal pattern BAP1. The first barrier metal pattern BAP1 may have a letter U shape. The first barrier metal pattern BAP1 may have a top surface at substantially the same level as that of a top surface of the fourth interlayer dielectric layer 140. The first barrier metal pattern BAP1 may directly contact the fourth interlayer dielectric layer 140, the first etch stop layer 135, and the third interlayer dielectric layer 130.

The first barrier metal pattern BAP1 may be provided on the first metal pattern MEP1. The first barrier metal pattern BAP1 may cover or overlap a bottom surface and opposite sidewalls of the first metal pattern MEP1. The first metal pattern MEP1 may have a top surface at a level substantially the same as or lower than that that of the top surface of the fourth interlayer dielectric layer 140. Although not shown, the first metal pattern MEP1 may have a convex top surface. Each of the first and second power lines PIL1 and PIL2 may have a pair of lateral surfaces which face each other and each of which has a tapered shape with respect to the top surface (or bottom surface) of the fourth interlayer dielectric layer 140.

Figure 9A:
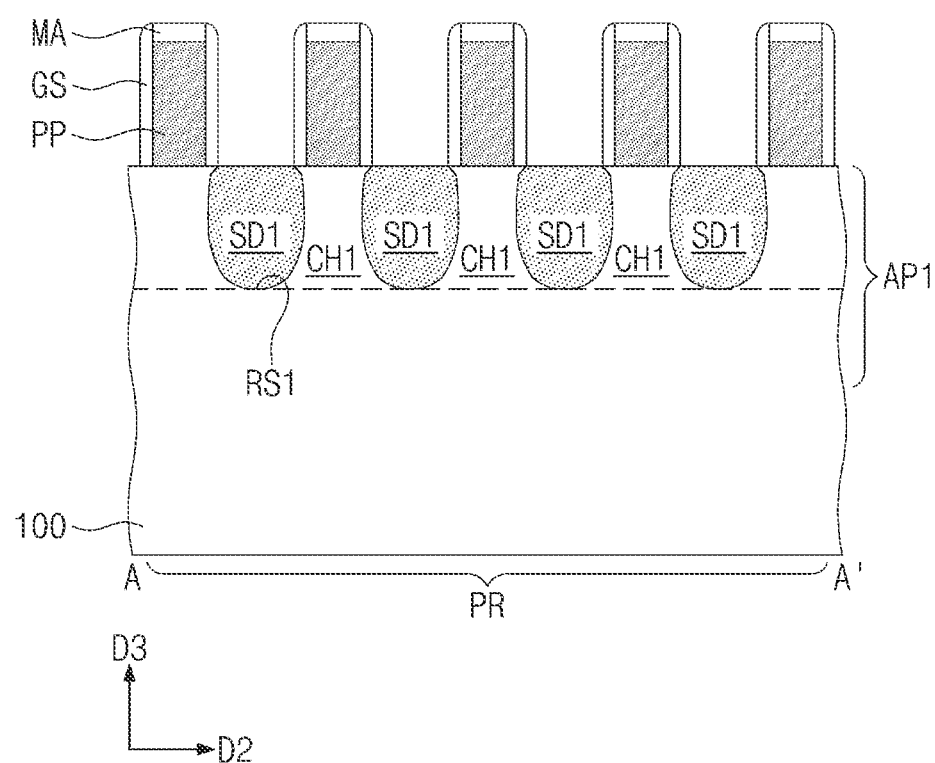
Figure 9B:
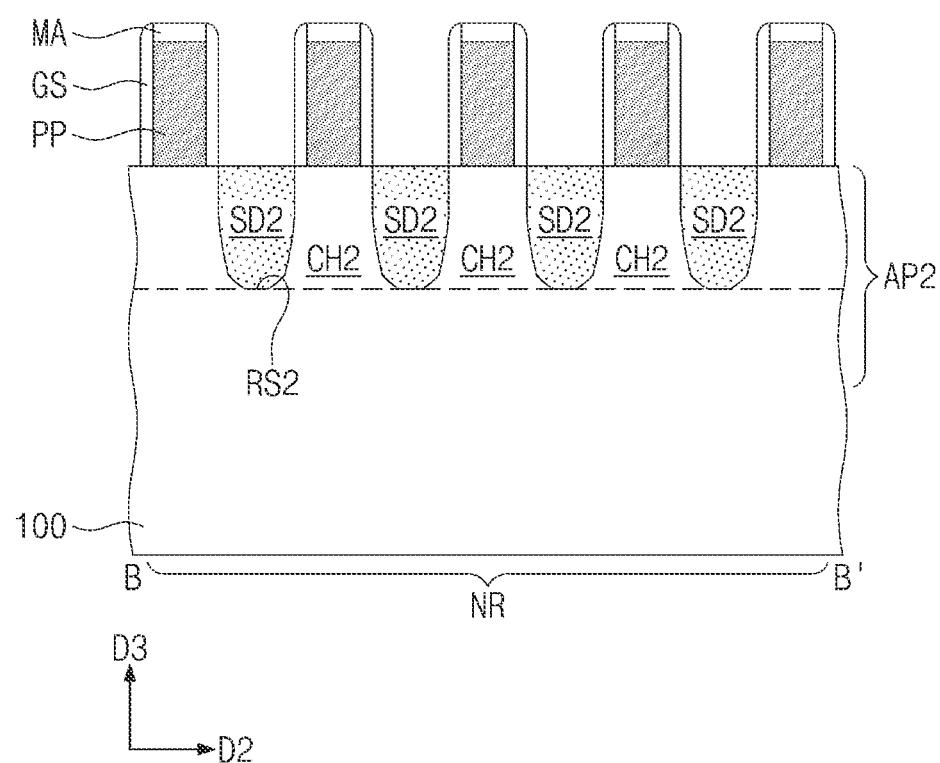
Figure 9C:
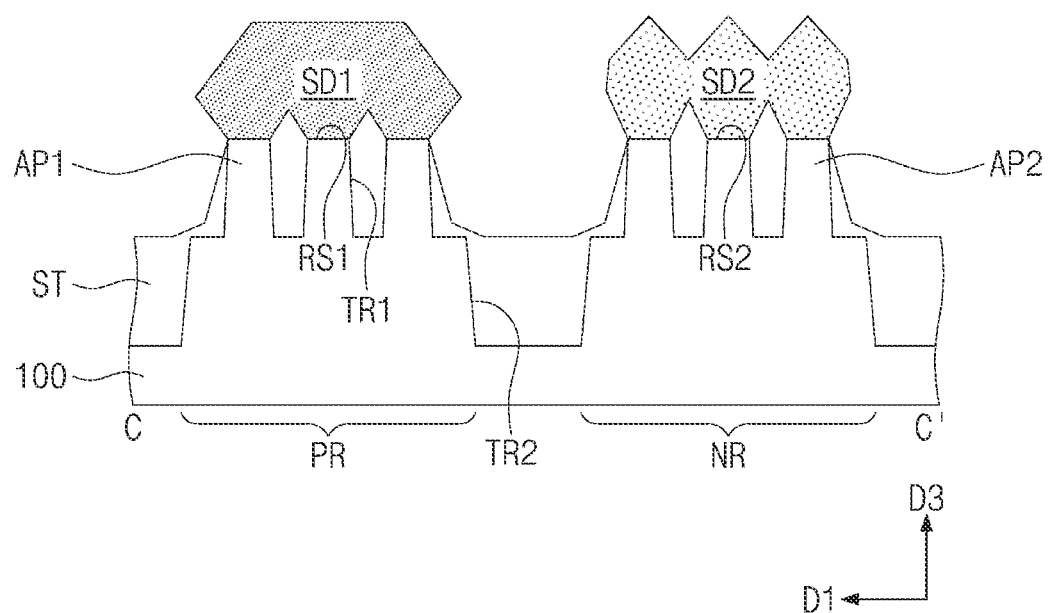
FIGS. 9C, 11C, and 14C illustrate cross-sectional views taken along line C-C' of FIGS. 8, 10, and 13, respectively.
Figure 9D:
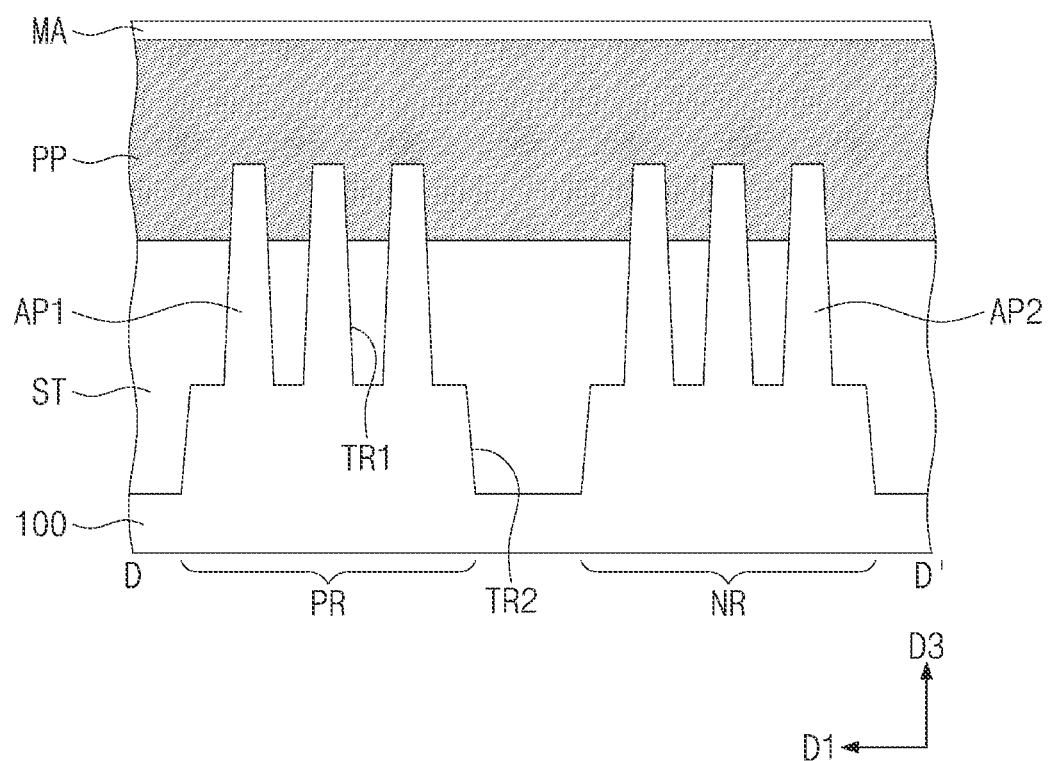
FIGS. 9D, 11D, and 14D illustrate cross-sectional views taken along line D-D' of FIGS. 8, 10, and 13, respectively.
Figure 10:
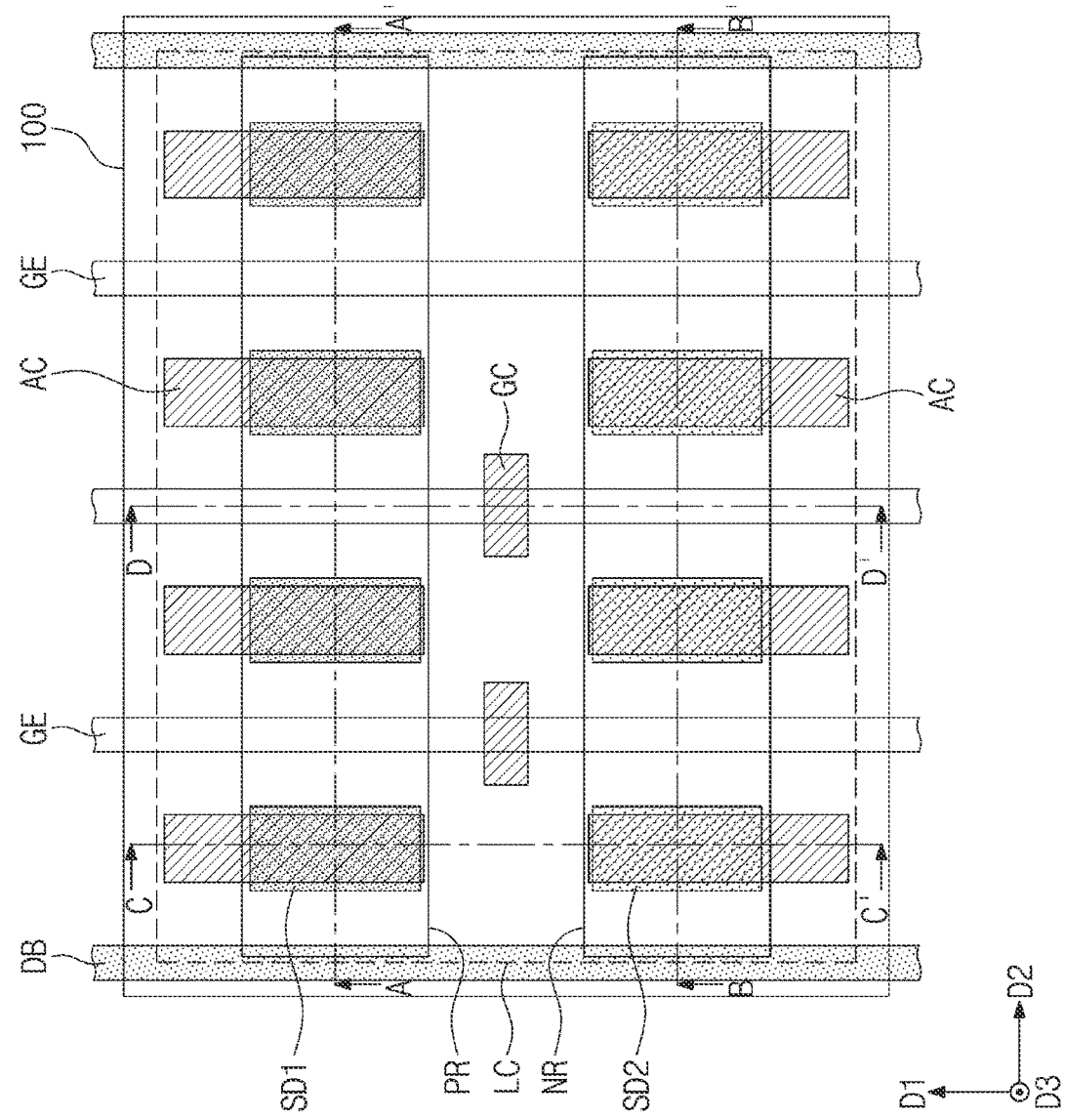
Figure 11A:
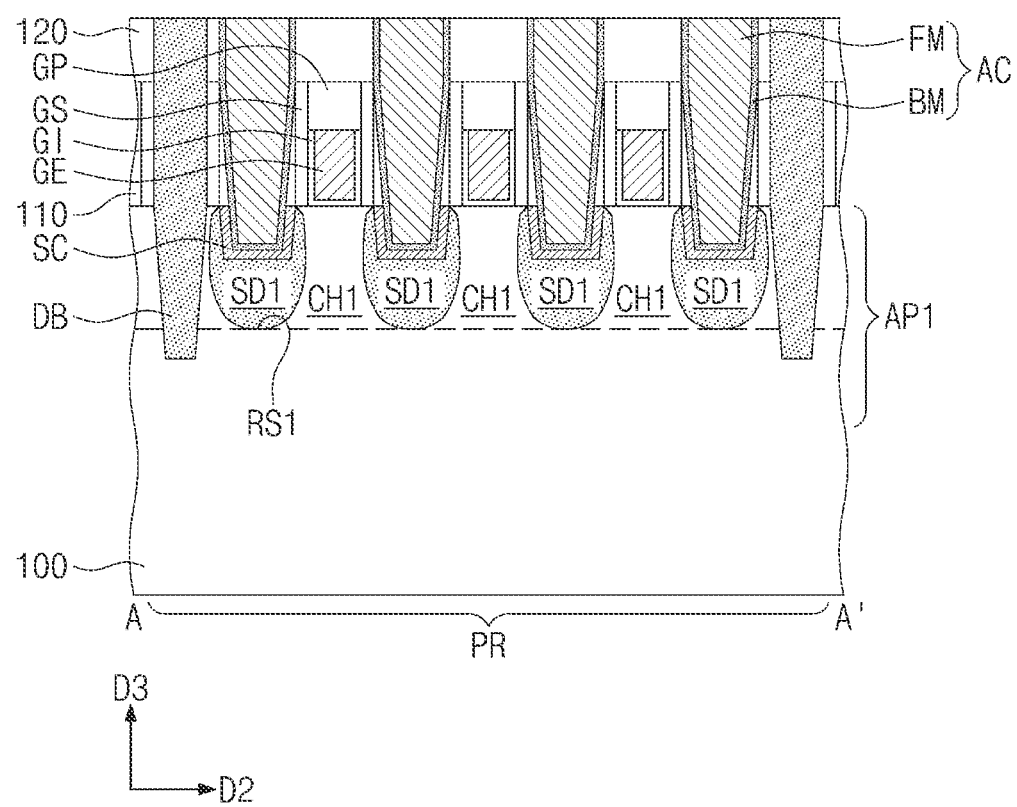
Figure 11B:
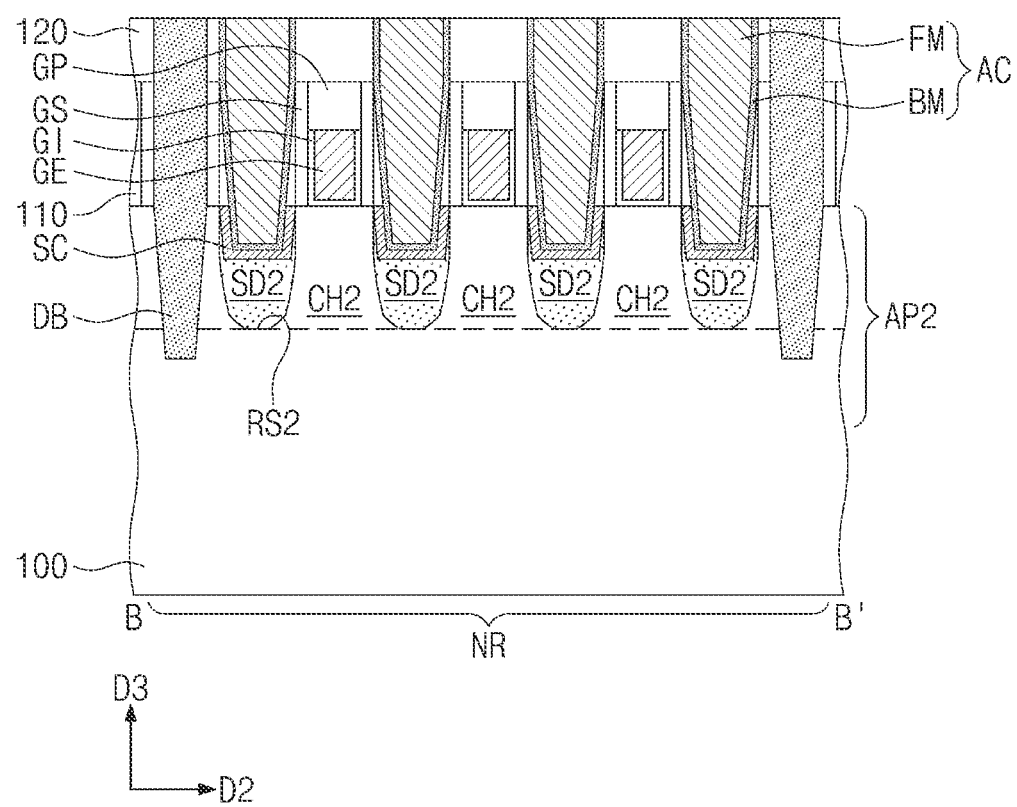
Figure 11C:
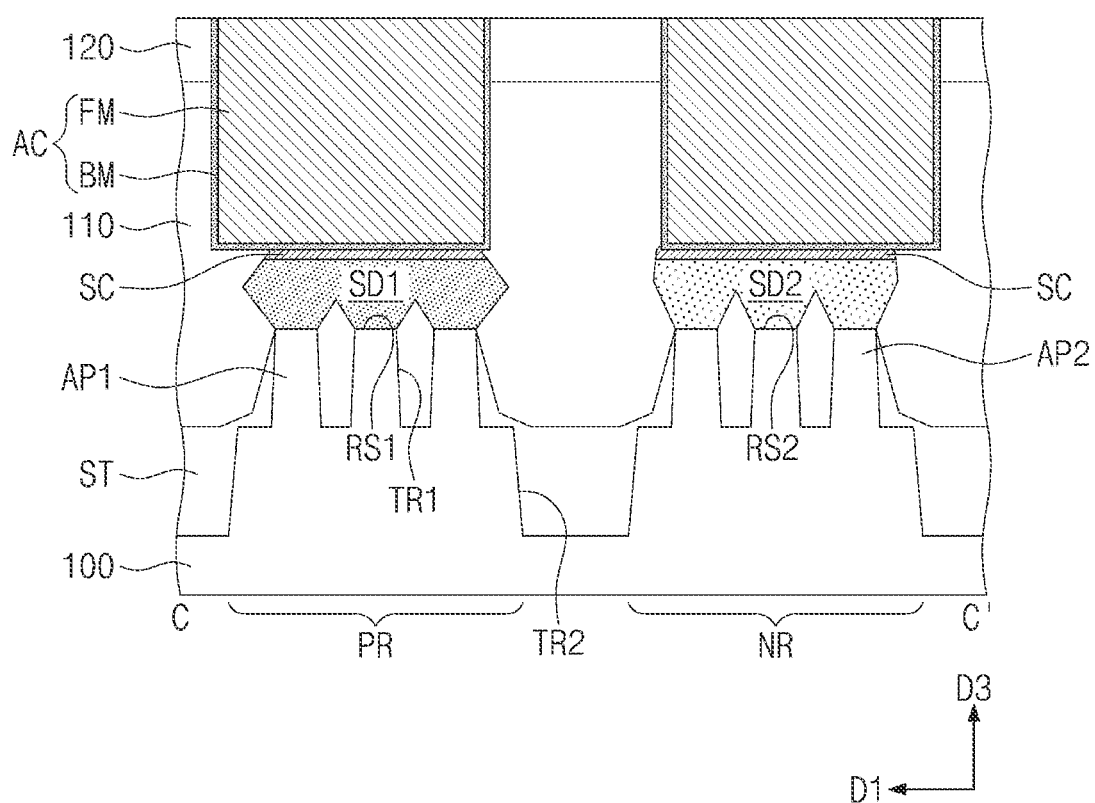
Figure 11D:
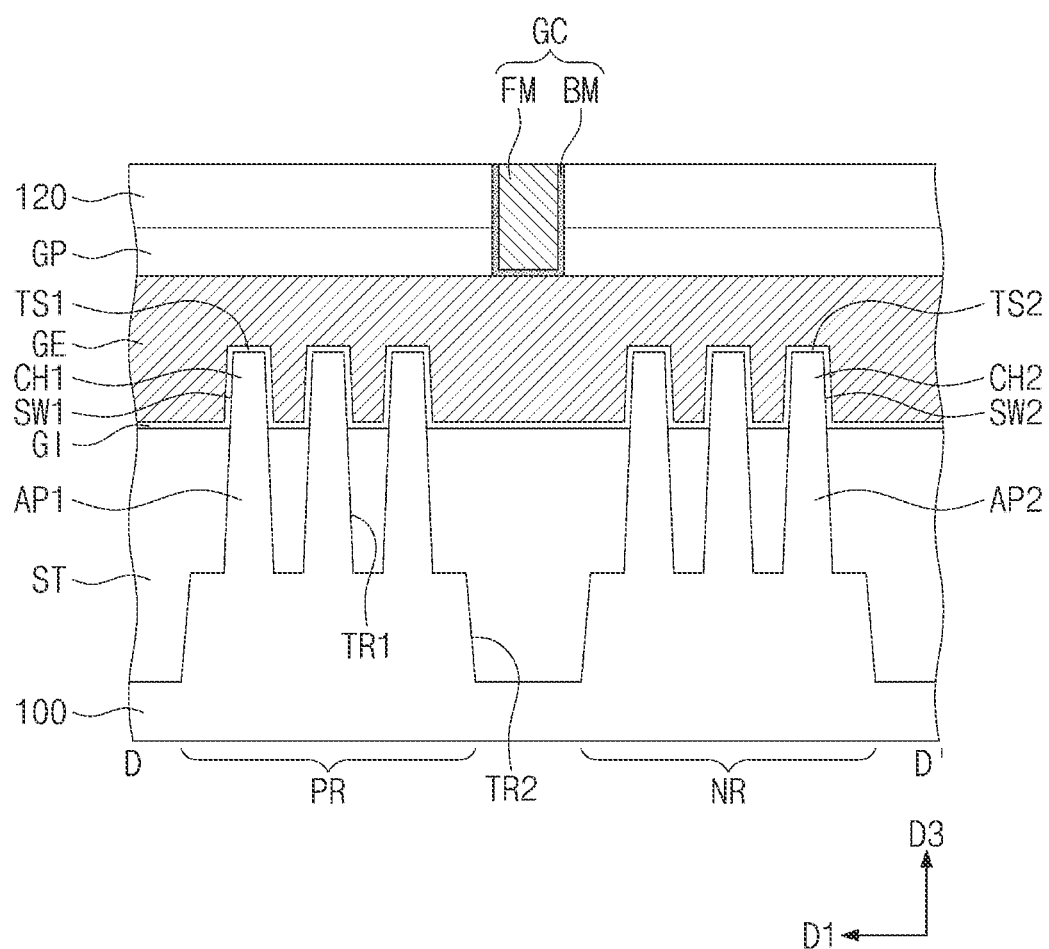
Figure 12A:
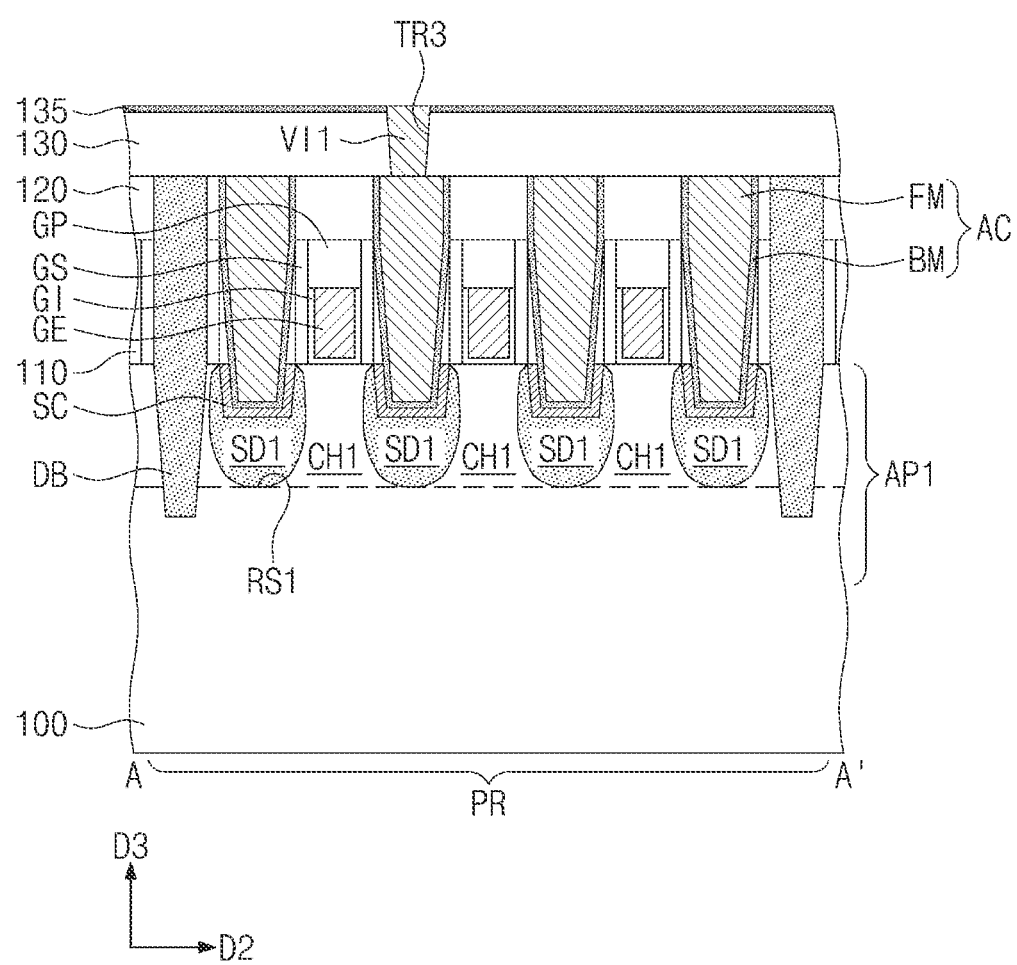
FIGS. 12A, 12B, 12C, and 12D illustrate cross-sectional views respectively taken along lines A-A', B-B', C-C', and D-D' of FIG. 10, showing a method of fabricating a semiconductor device according to some embodiments of the present inventive concepts.
Figure 12B:
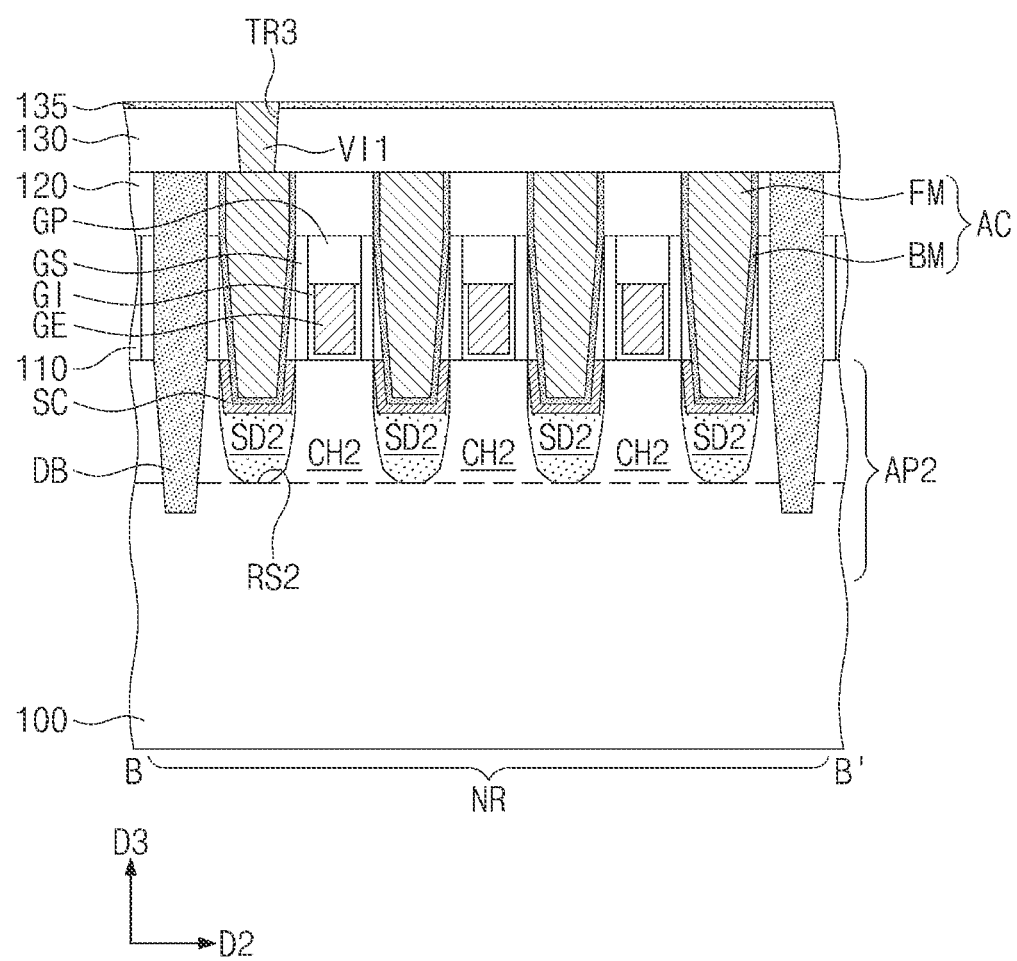
Figure 12C:
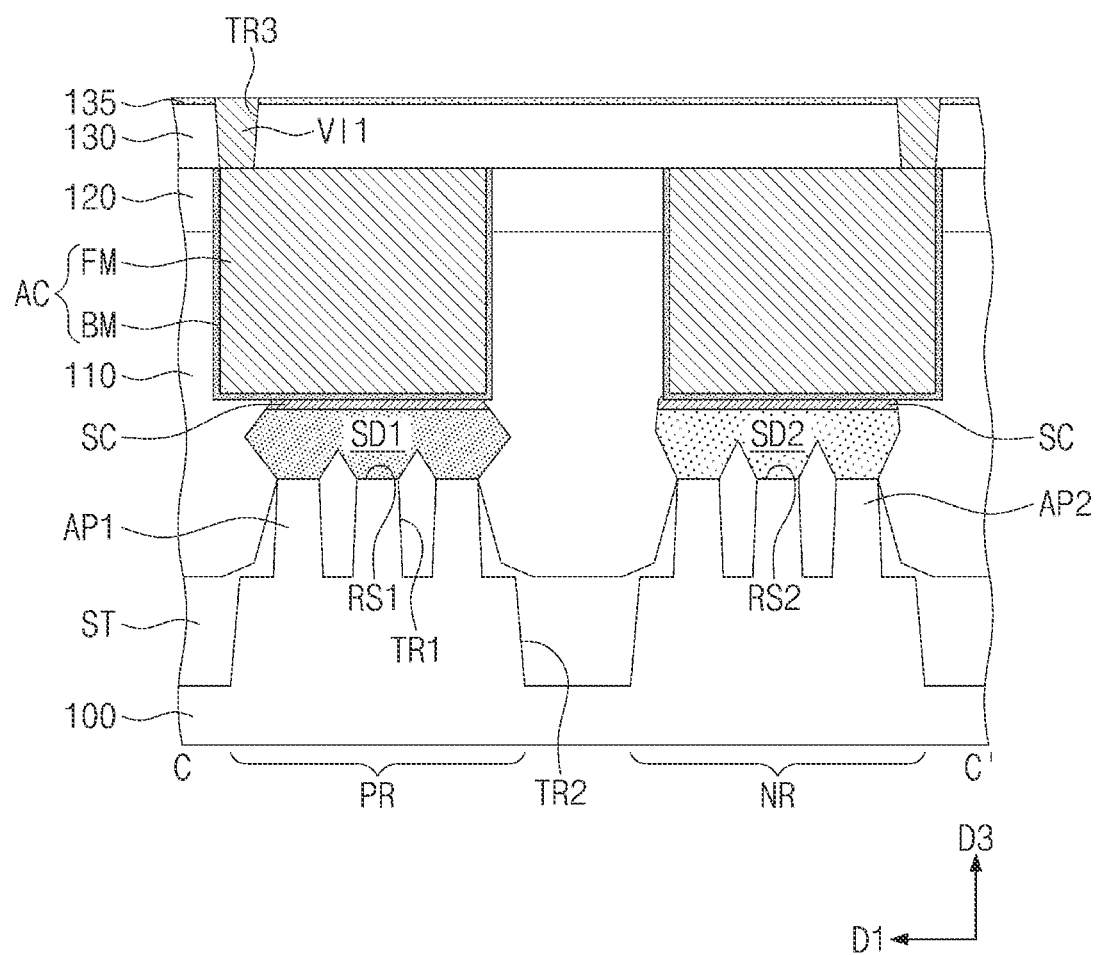
Figure 12D:
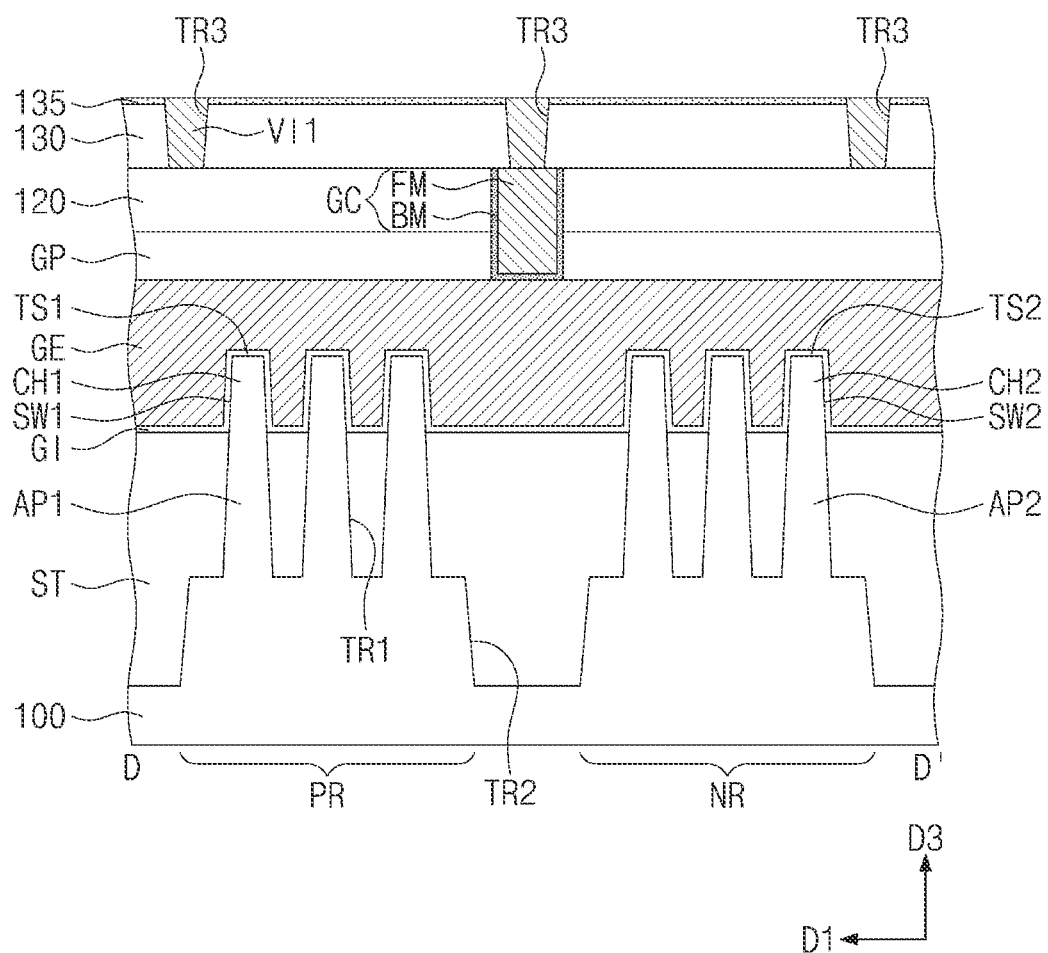
Figure 13:
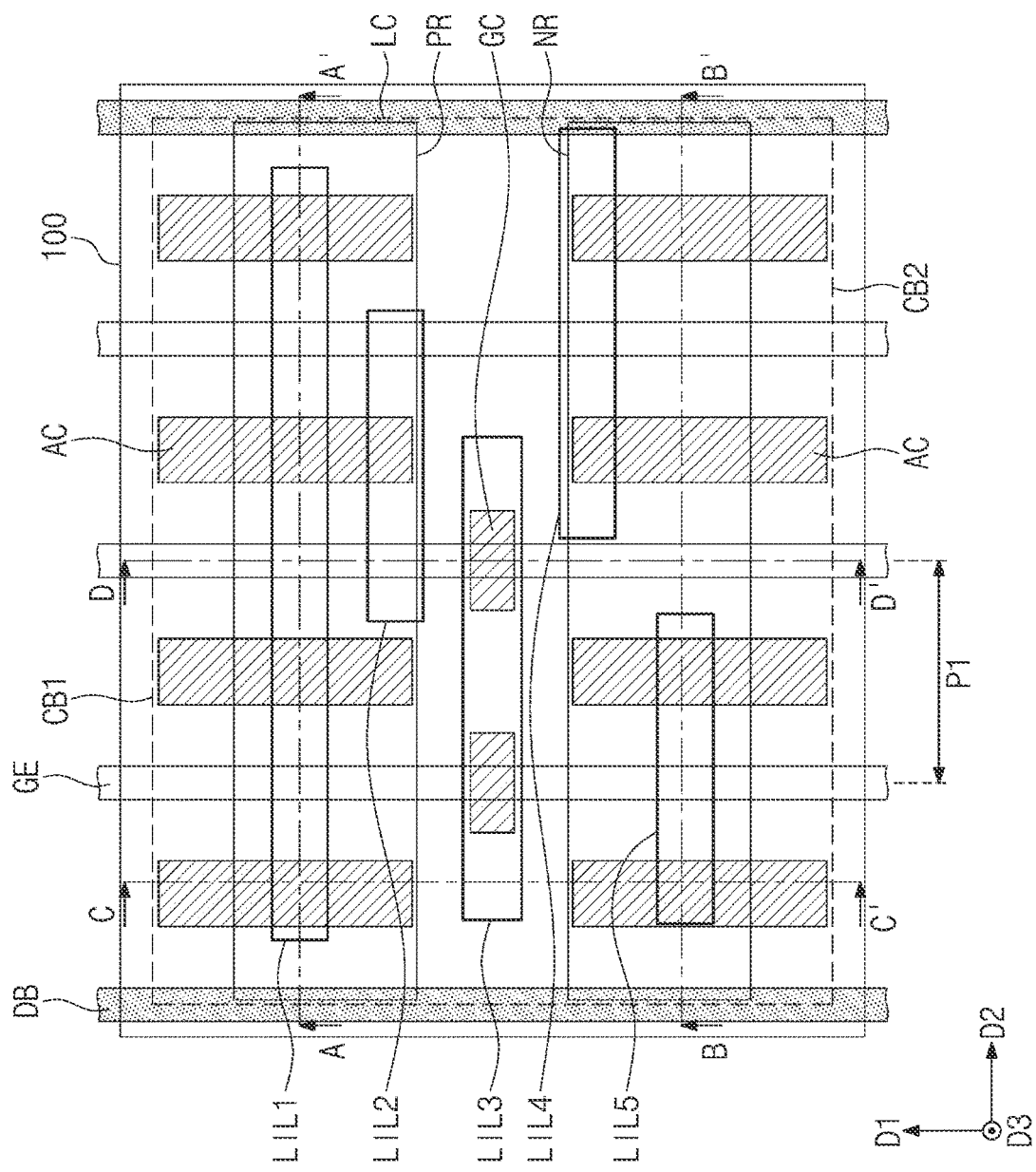
Figure 14A:
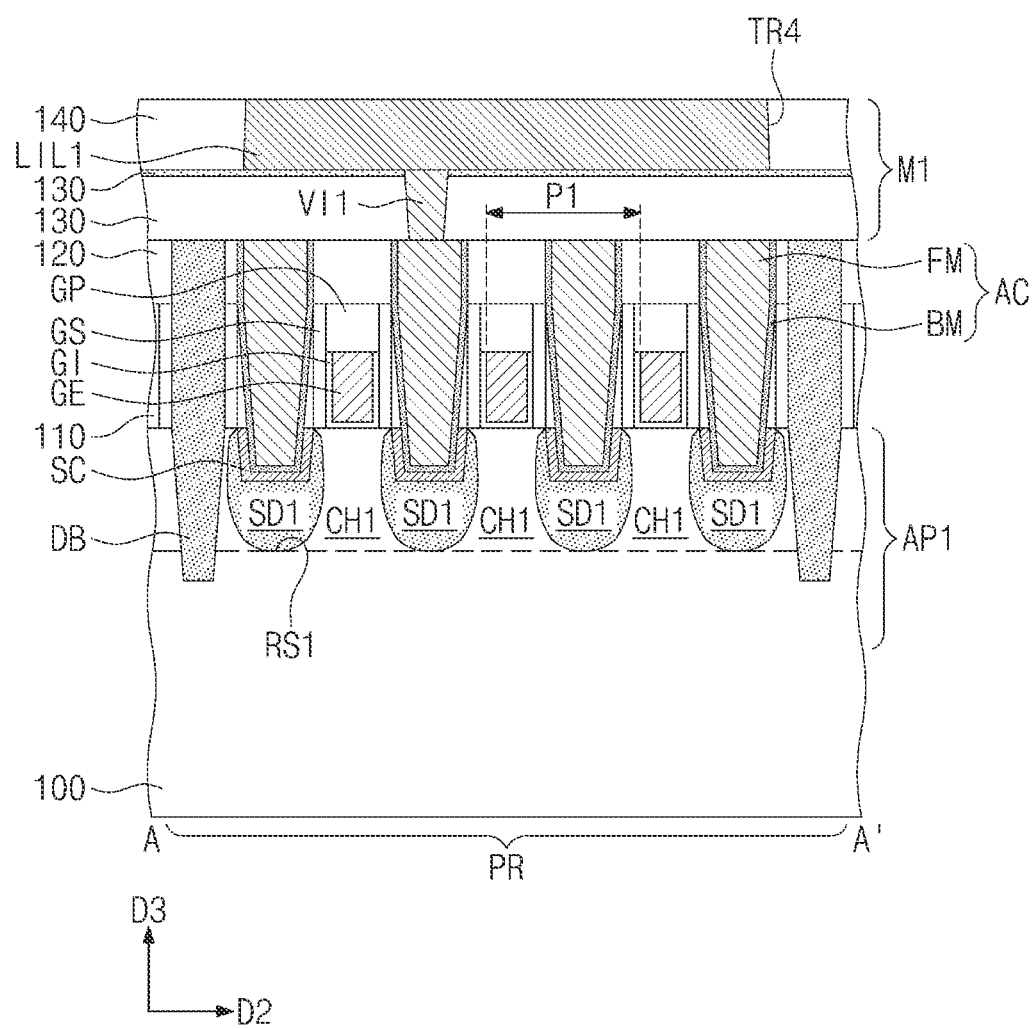
Figure 14B:
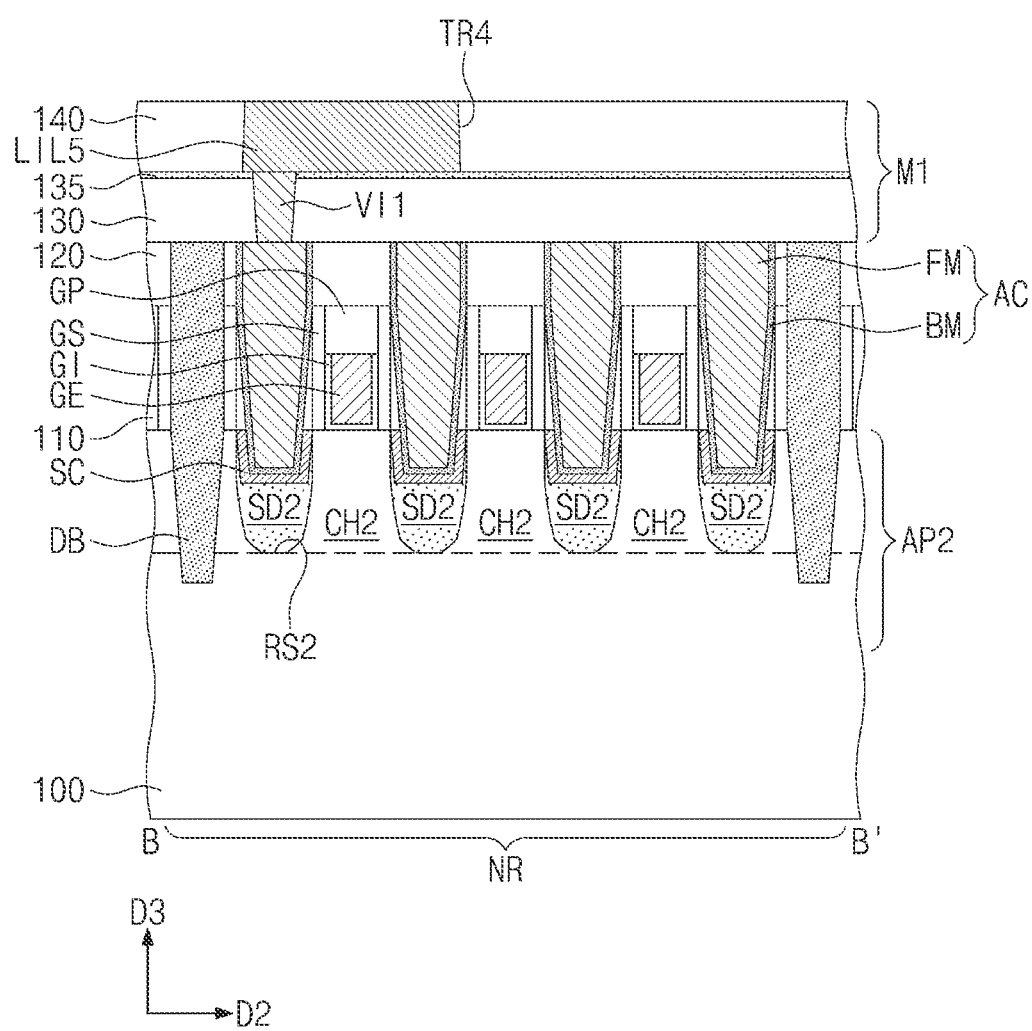
Figure 14C:
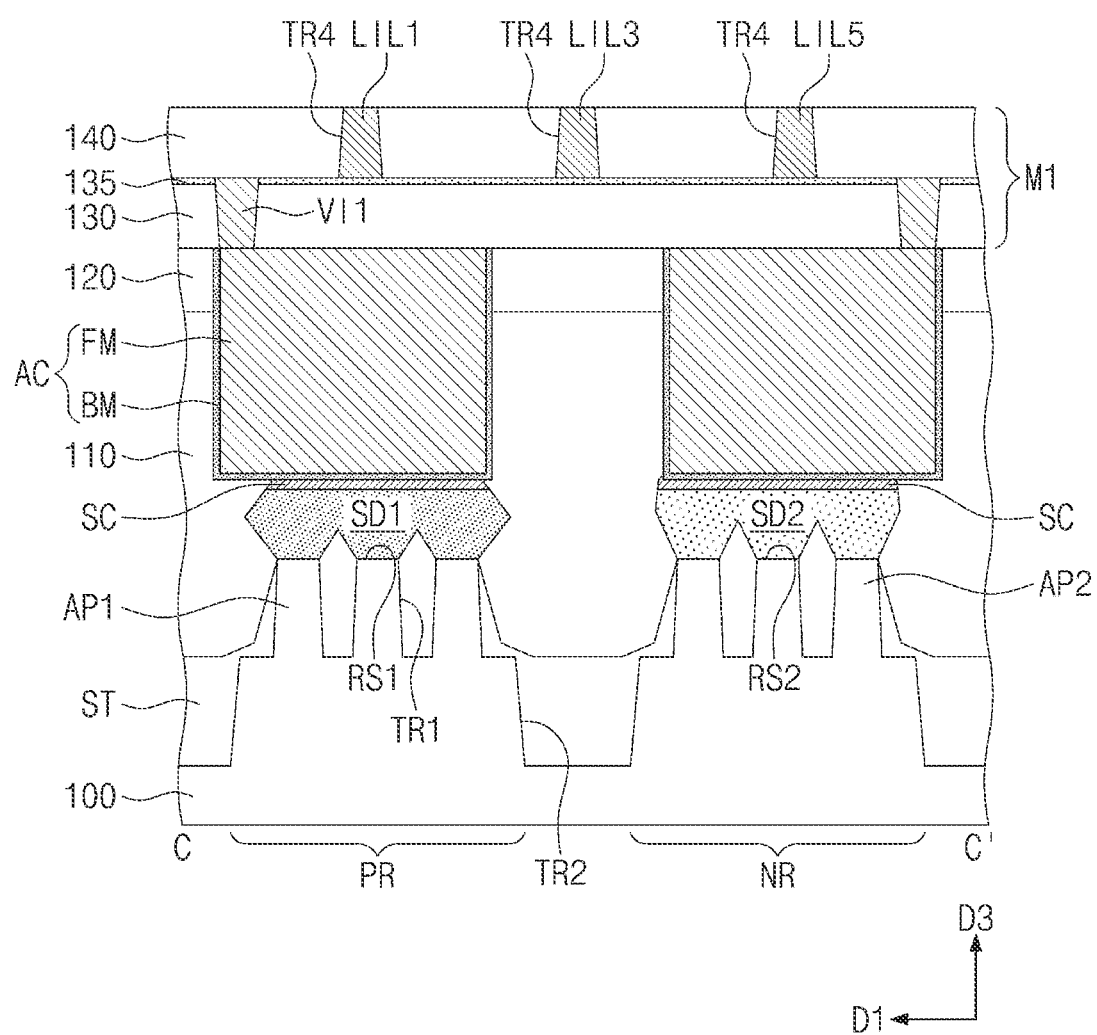
Figure 14D:
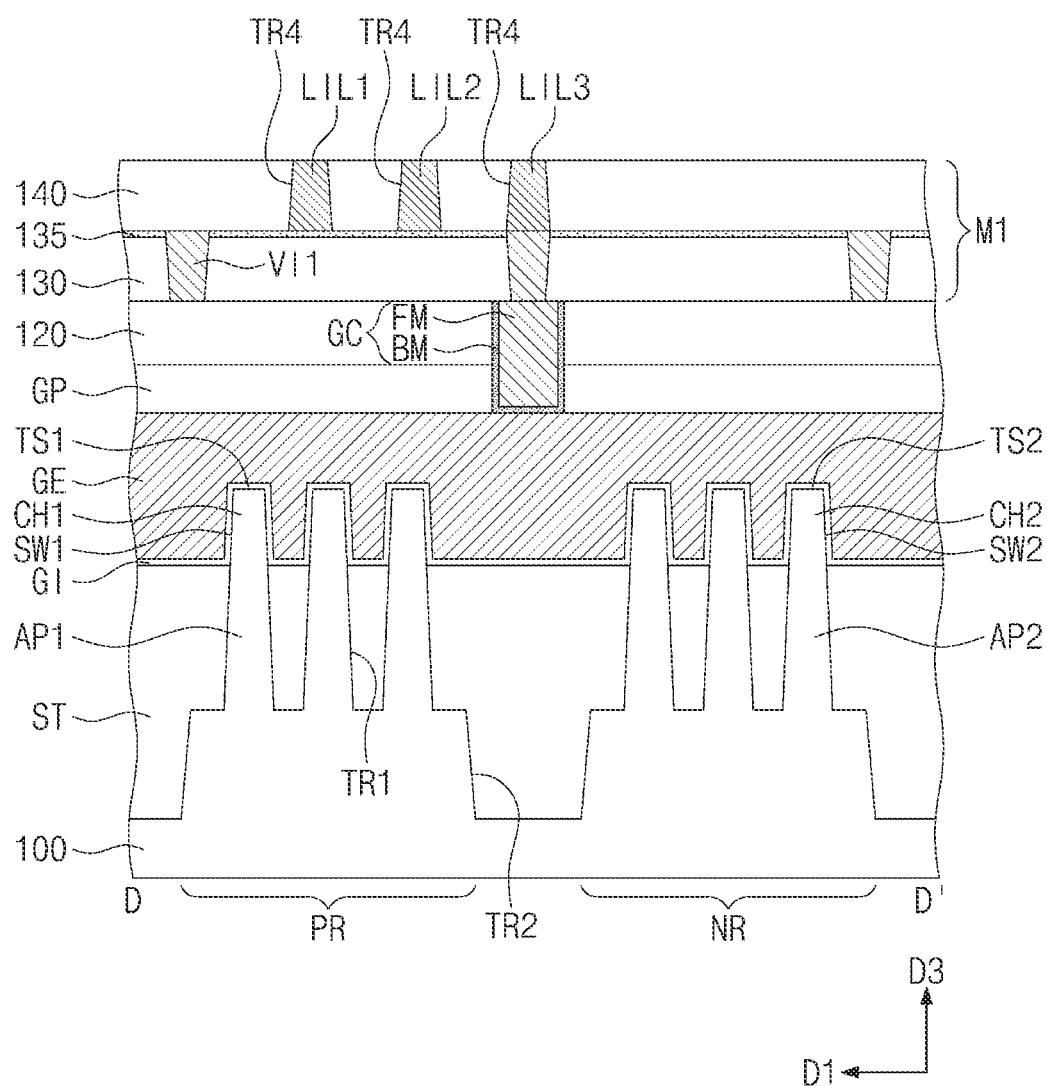
Figure 15:
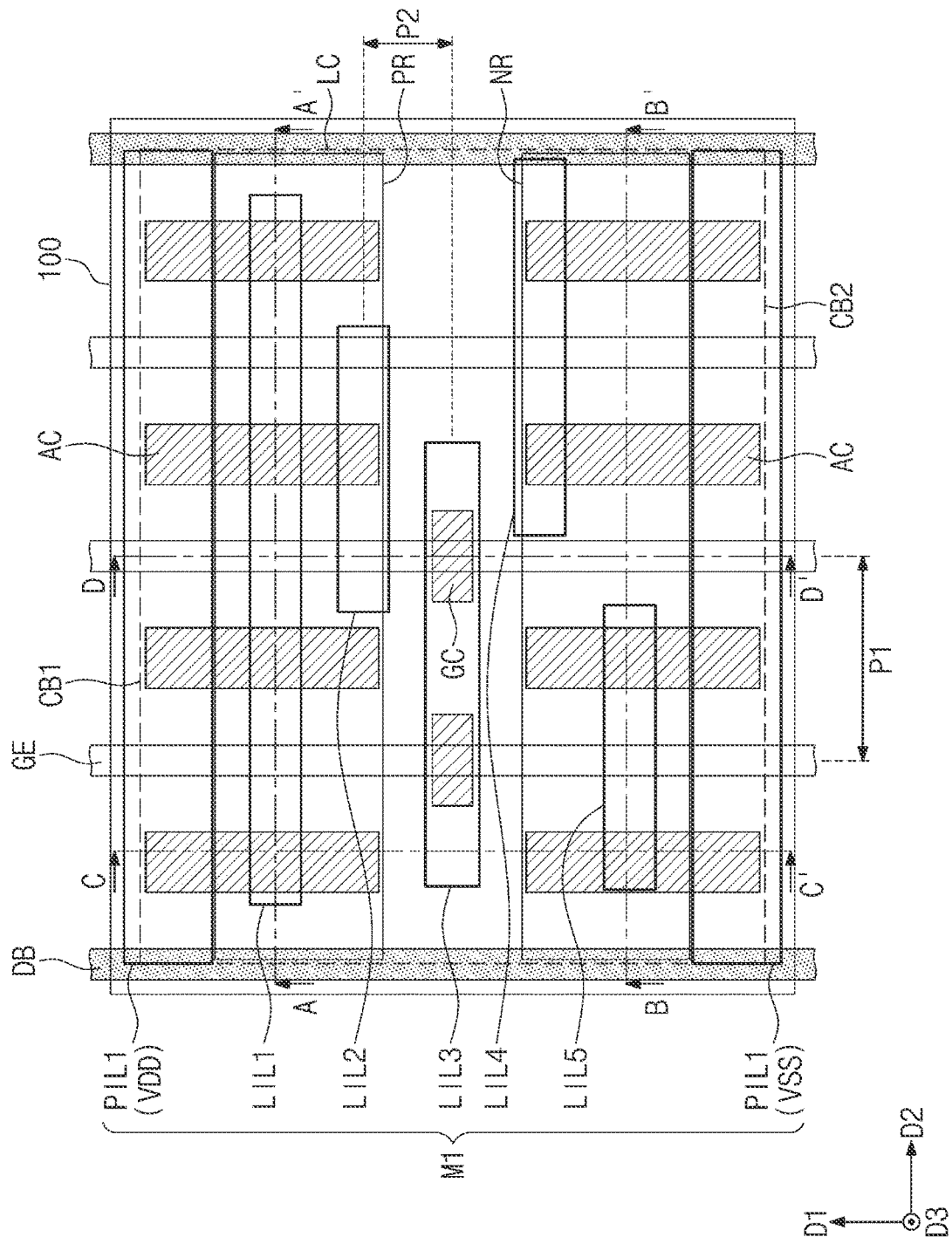

FIGS. 4, 6, 8, 10, 13, and 15 illustrate plan views showing a method of fabricating a semiconductor device according to some embodiments of the present inventive concepts. FIGS. 5, 7A, 9A, 11A, 14A, and 16A illustrate cross-sectional views taken along line A-A' of FIGS. 4, 6, 8, 10, 13, and 15, respectively. FIGS. 7B, 9B, 11B, 14B, and 16B illustrate cross-sectional views taken along line B-B' of FIGS. 6, 8, 10, 13, and 15, respectively. FIGS. 9C, 11C, and 14C illustrate cross-sectional views taken along line C-C' of FIGS. 8, 10, and 13, respectively. FIGS. 9D, 11D, and 14D illustrate cross-sectional views taken along line D-D' of FIGS. 8, 10, and 13, respectively. FIGS. 12A, 12B, 12C, and 12D illustrate cross-sectional views respectively taken along lines A-A', B-B', C-C', and D-D' of FIG. 10, showing a method of fabricating a semiconductor device according to some embodiments of the present inventive concepts. FIGS. 17A, 17B, 17C, and 17D illustrate cross-sectional views respectively taken along lines A-A', B-B', C-C', and D-D' of FIG. 15, showing a method of fabricating a semiconductor device according to some embodiments of the present inventive concepts.

Figure 4:
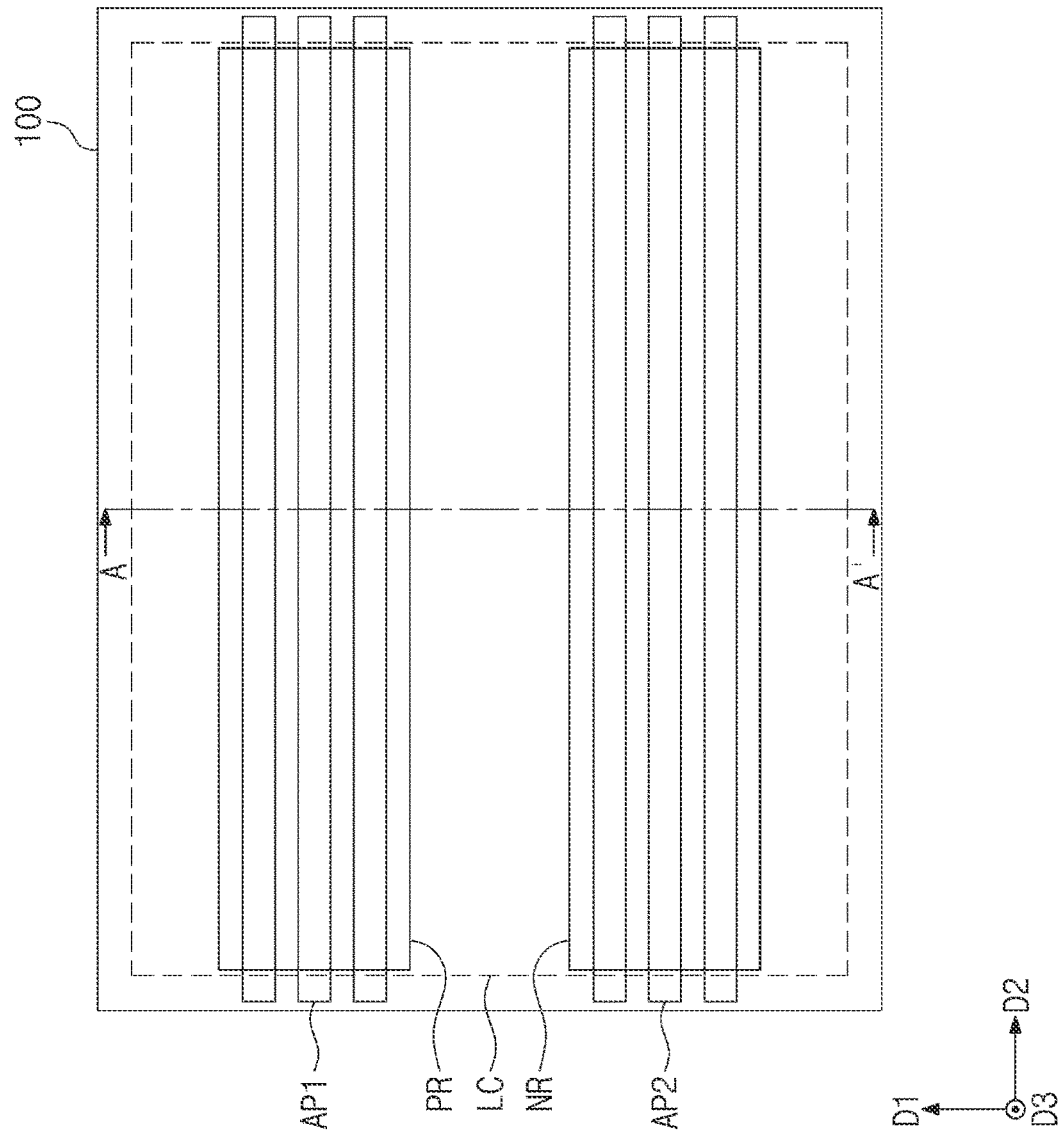
FIGS. 4, 6, 8, 10, 13, and 15 illustrate plan views showing a method of fabricating a semiconductor device according to some embodiments of the present inventive concepts.
Figure 5:
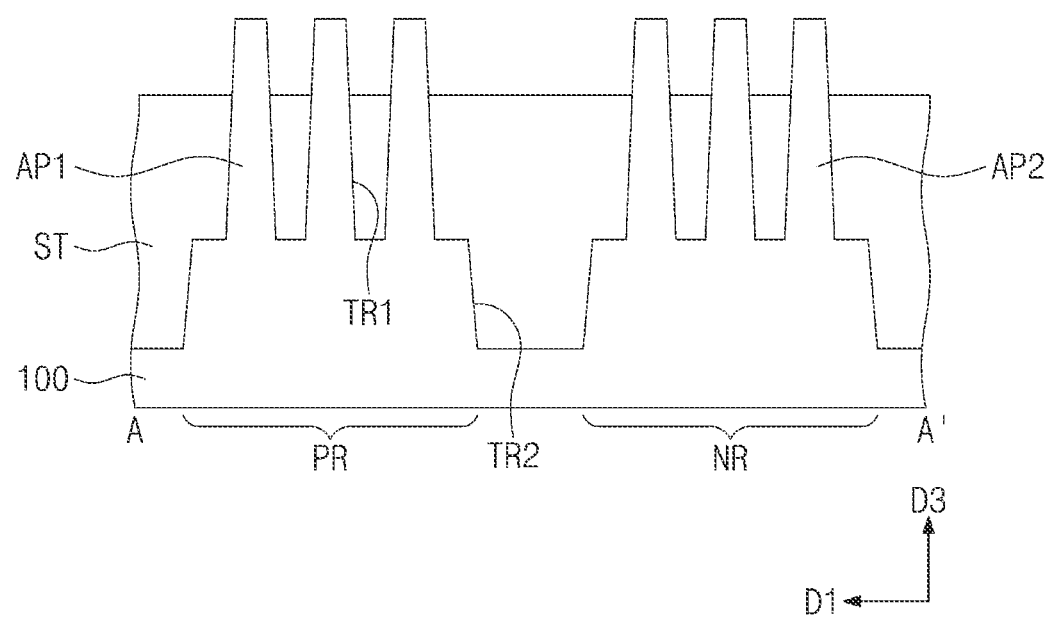
FIGS. 5, 7A, 9A, 11A, 14A, and 16A illustrate cross-sectional views taken along line A-A' of FIGS. 4, 6, 8, 10, 13, and 15, respectively.

Referring to FIGS. 4 and 5, a substrate 100 may be provided which includes a first active region PR and a second active region NR. The first active region PR and the second active region NR may define a logic cell LC on the substrate 100.

The substrate 100 may be patterned to form first and second active patterns AP1 and AP2. The first active patterns AP1 may be formed on the first active region PR, and the second active patterns AP2 may be formed on the second active region NR. A first trench TR1 may be formed between ones of the first active patterns AP1 and/or between ones of the second active patterns AP2. The substrate 100 may be patterned to form a second trench TR2 between the first active region PR that includes the first active patterns AP1 and the second active region NR that includes the second active patterns AP2. The second trench TR2 may be formed deeper than the first trench TR1 with respect to the substrate 100.

A device isolation layer ST may be formed on the substrate 100, filling the first and second trenches TR1 and TR2. The device isolation layer ST may include a dielectric material, such as a silicon oxide layer. The device isolation layer ST may be recessed until upper portions of the first and second active patterns AP1 and AP2 are exposed. Thus, the upper portions of the first and second active patterns AP1 and AP2 may vertically protrude upwards from the device isolation layer ST.

Figure 6:
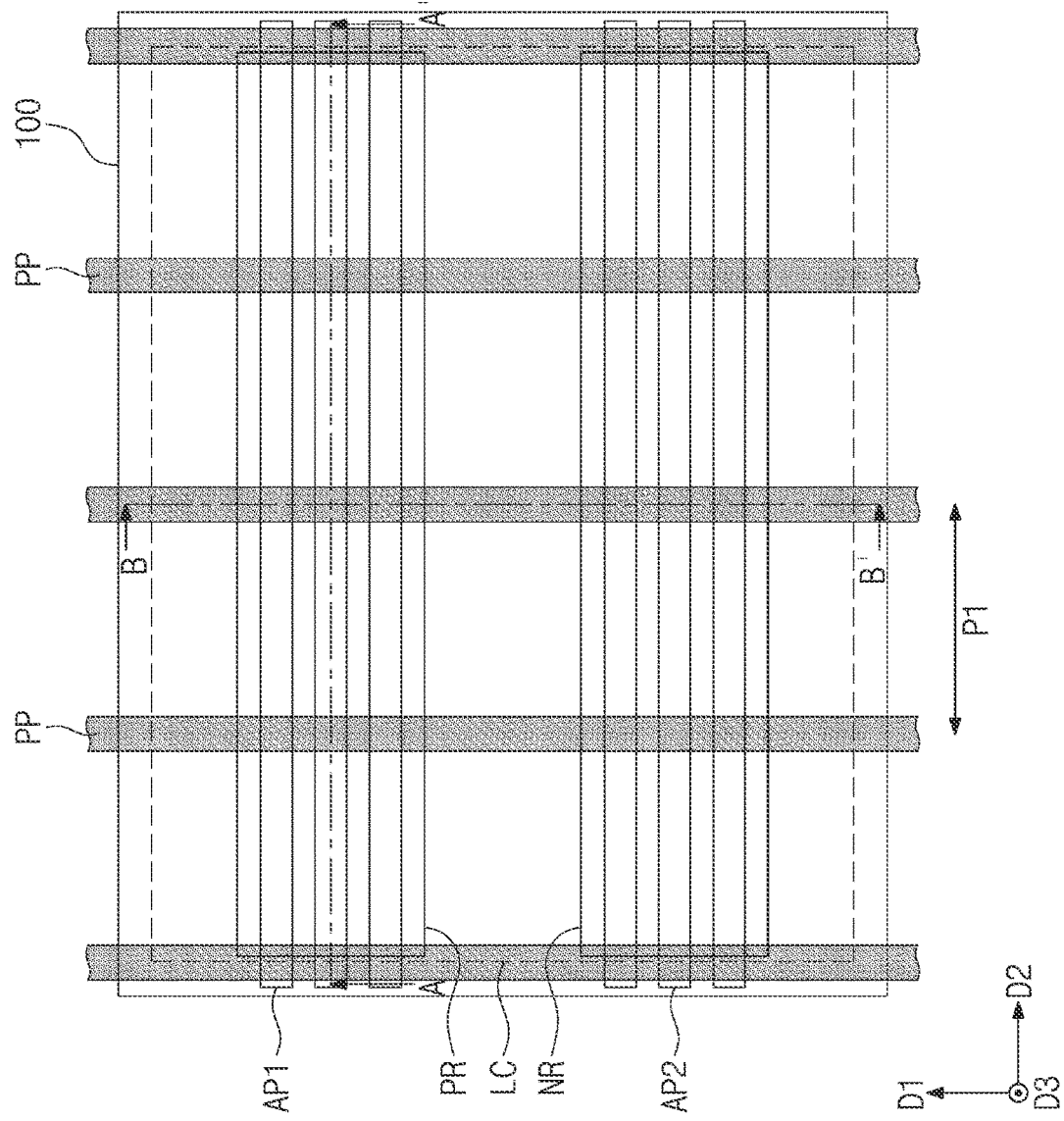
Figure 7A:
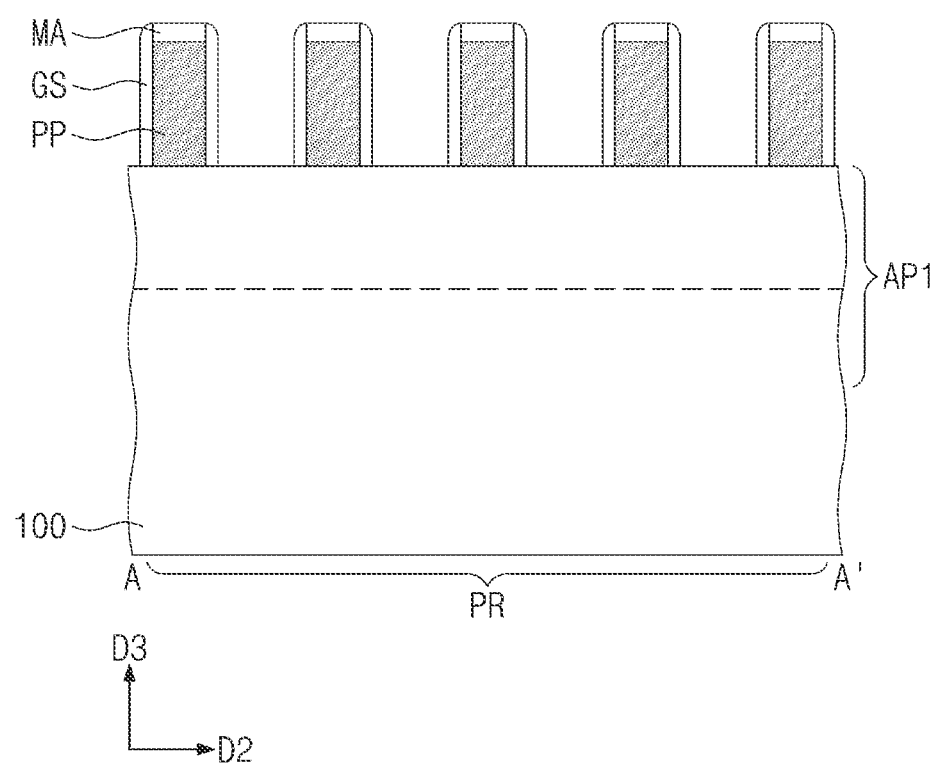
Figure 7B:
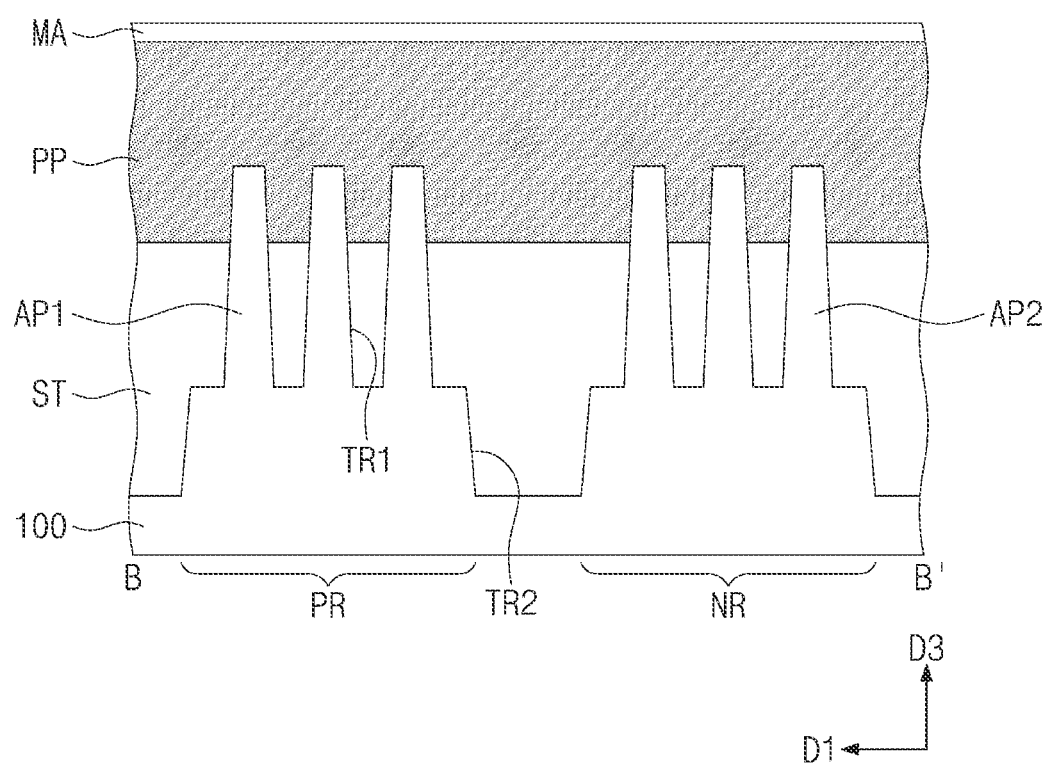
FIGS. 7B, 9B, 11B, 14B, and 16B illustrate cross-sectional views taken along line B-B' of FIGS. 6, 8, 10, 13, and 15, respectively.
Figure 8:
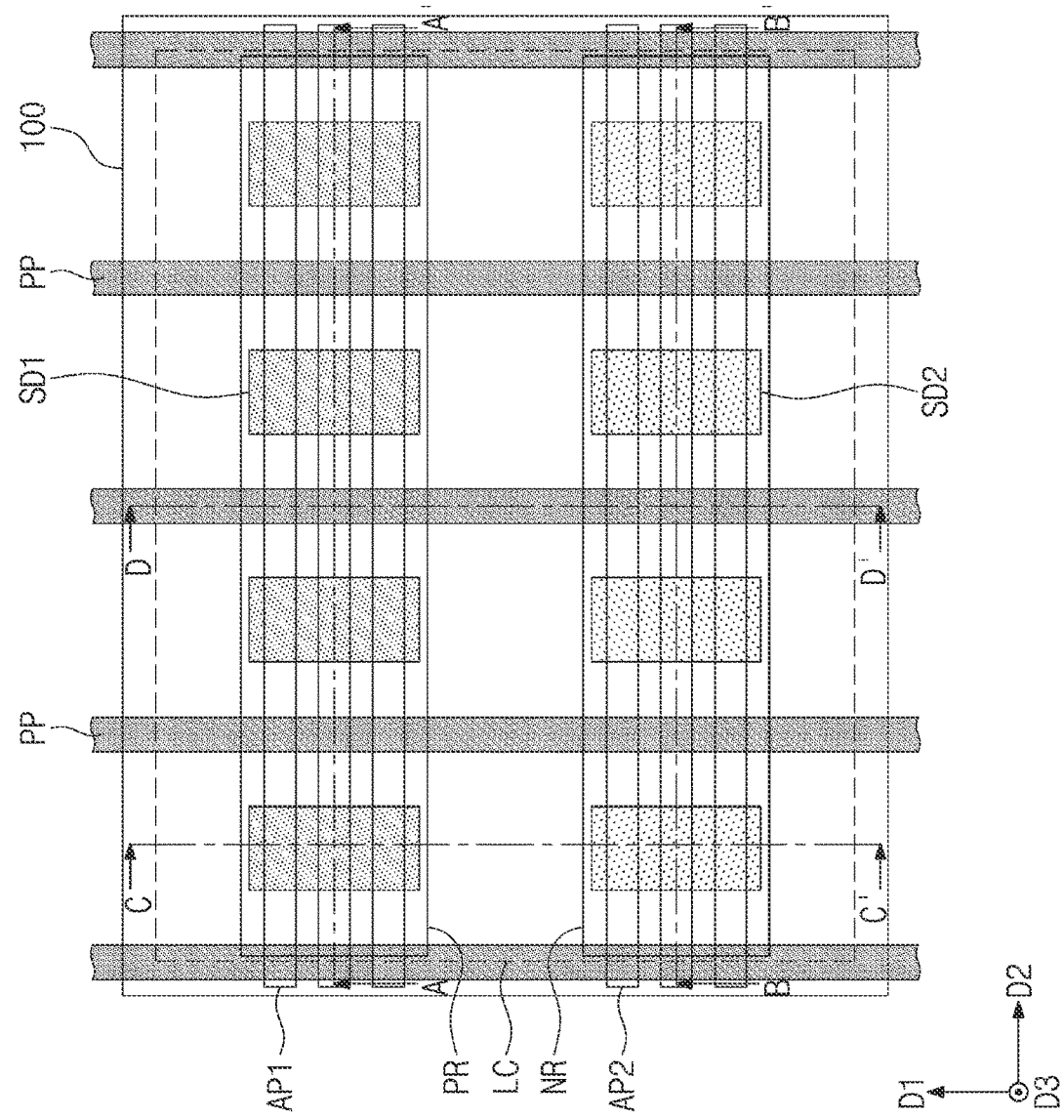

Referring to FIGS. 6, 7A, and 7B, sacrificial patterns PP may be formed to run across the first and second active patterns AP1 and AP2. Each of the sacrificial patterns PP may be formed to have a linear or bar shape that extends in a first direction D1. As shown in FIG. 6, the sacrificial patterns PP may be formed to be arranged at a first pitch P1 along a second direction D2.

For example, the formation of the sacrificial patterns PP may include forming a sacrificial layer on an entire surface of the substrate 100, forming hardmask patterns MA on the sacrificial layer, and using the hardmask patterns MA as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. In some embodiments, the gate spacer layer may be a multi-layer including at least two selected from SiCN, SiCON, and/or SiN.

Referring to FIGS. 8 and 9A to 9D, first source/drain patterns SD1 may be formed on the upper portion of the first active pattern AP1. A pair of first source/drain patterns SD1 may be formed on opposite sides of each of the sacrificial patterns PP.

For example, first recessions RSR1 may be formed by using the hardmask patterns MA and the gate spacers GS as an etching mask to etch the upper portion of the first active pattern AP1. During the etching of the upper portion of the first active pattern AP1, the device isolation layer ST may be recessed between the first active patterns AP1 (see FIG. 9C).

The first source/drain pattern SD1 may be formed by performing a selective epitaxial growth process in which an inner wall of the first recession RSR1 of the first active pattern AP1 is used as a seed layer. The formation of the first source/drain patterns SD1 may define a first channel pattern CH1 between a pair of first source/drain patterns SD1. For example, the selective epitaxial growth process may include chemical vapor deposition (CVD) or molecular beam epitaxy (MBE). The first source/drain patterns SD1 may include a semiconductor element (e.g., SiGe) whose lattice constant is greater than that of a semiconductor element of the substrate 100. Each of the first source/drain patterns SD1 may be formed of a plurality of semiconductor layers.

For example, impurities may be in-situ implanted during the selective epitaxial growth process for forming the first source/drain patterns SD1. For another example, after the first source/drain patterns SD1 are formed, impurities may be implanted into the first source/drain patterns SD1. The first source/drain patterns SD1 may be doped to have a first conductivity type (e.g., p-type).

Second source/drain patterns SD2 may be formed on the upper portion of the second active pattern AP2. A pair of second source/drain patterns SD2 may be formed on opposite sides of each of the sacrificial patterns PP.

For example, second recessions RSR2 may be formed by using the hardmask patterns MA and the gate spacers GS as an etching mask to etch the upper portion of the second active pattern AP2. The second source/drain pattern SD2 may be formed by performing a selective epitaxial growth process in which an inner wall of the second recession RSR2 of the second active pattern AP2 is used as a seed layer. The formation of the second source/drain patterns SD2 may define a second channel pattern CH2 between a pair of the second source/drain patterns SD2. For example, the second source/drain patterns SD2 may include the same semiconductor element (e.g., Si) as that of the substrate 100. The second source/drain patterns SD2 may be doped to have a second conductivity type (e.g., n-type).

Different processes may be performed to sequentially form the first source/drain patterns SD1 and the second source/drain patterns SD2. For example, the first and second source/drain patterns SD1 and SD2 may not be formed at the same time.

Referring to FIGS. 10 and 11A to 11D, a first interlayer dielectric layer 110 may be formed to cover or overlap the first and second source/drain patterns SD1 and SD2, the hardmask patterns MA, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MA may be removed during the planarization process. As a result, the first interlayer dielectric layer 110 may have a top surface coplanar with those of the sacrificial patterns PP and those of the gate spacers GS.

The sacrificial patterns PP may be replaced with corresponding gate electrodes GE. For example, the exposed sacrificial patterns PP may be selectively removed. The removal of the sacrificial patterns PP may form hollow spaces. A gate dielectric layer GI, a gate electrode GE, and a gate capping pattern GP may be formed in each of the hollow spaces. The gate electrode GE may include a first metal pattern and a second metal pattern on the first metal pattern. The first metal pattern may be formed of a work-function metal capable of controlling a threshold voltage of a transistor, and the second metal pattern may be formed of metal whose resistance is low.

A second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and to have electrical connection with the first and second source/drain patterns SD1 and SD2. A gate contact GC may be formed to penetrate the second interlayer dielectric layer 120 and the gate capping pattern GP and to have electrical connection with the gate electrode GE.

A pair of separation structures DB may be formed on opposite sides of the logic cell LC, which opposite sides face each other in the second direction D2. The separation structures DB may be formed to overlap the gate electrodes GE formed on the opposite sides of the logic cell LC. For example, the formation of the separation structures DB may include forming a hole that penetrates the first and second interlayer dielectric layers 110 and 120 and extends into the first and second active patterns AP1 and AP2, and then filling the hole with a dielectric layer.

Referring to FIGS. 12A to 12D, first vias VI1 may be formed to penetrate a third interlayer dielectric layer 130. The first vias VI1 may be formed by a single damascene process. For example, a third interlayer dielectric layer 130 and a first etch stop layer 135 may be formed on the second interlayer dielectric layer 120. The first etch stop layer 135 may be patterned to define locations on which the first vias VI1 will be formed. The first etch stop layer 135 may be used as a mask to etch the third interlayer dielectric layer 130 to form third trenches TR3. The first etch stop layer 135 may undergo an atomic layer deposition (ALD) process or a chemical vapor deposition (CVD) process to form a first metallic material layer that fills the third trenches TR3 and to cover or overlap a top surface of the first etch stop layer 135. A chemical mechanical polishing (CMP) process may be performed on the first metallic material layer until the first etch stop layer 135 is exposed, which may form the first vias VI1 provided in the third trenches TR3.

Referring to FIGS. 13 and 14A to 14D, first to fifth lower lines LIL1 to LIL5 and a fourth interlayer dielectric layer 140 may be formed. For example, the first etch stop layer 135 may undergo a physical vapor deposition (PVD) process to form a second metallic material layer. The second metallic material layer may cover or overlap the top surface of the first etch stop layer 135 and top surfaces of the first vias VI1 exposed by the first etch stop layer 135. Afterwards, the second metallic material layer may be etched to form fourth trenches TR4. Therefore, the first to fifth lower lines LIL1 to LIL5 may be formed. The fourth trenches TR4 may define the first to fifth lower lines LIL1 to LIL5. A dielectric material may be deposited on the fourth trenches TR4 to form a first dielectric layer that covers or overlaps insides of the fourth trenches TR4 and top surfaces of the first to fifth lower lines LIL1 to LIL5. A chemical mechanical polishing (CMP) process may be performed on the first dielectric layer until the top surfaces of the first to fifth lower lines LIL1 to LIL5 are exposed, which may form the fourth interlayer dielectric layer 140.

Figure 16A:
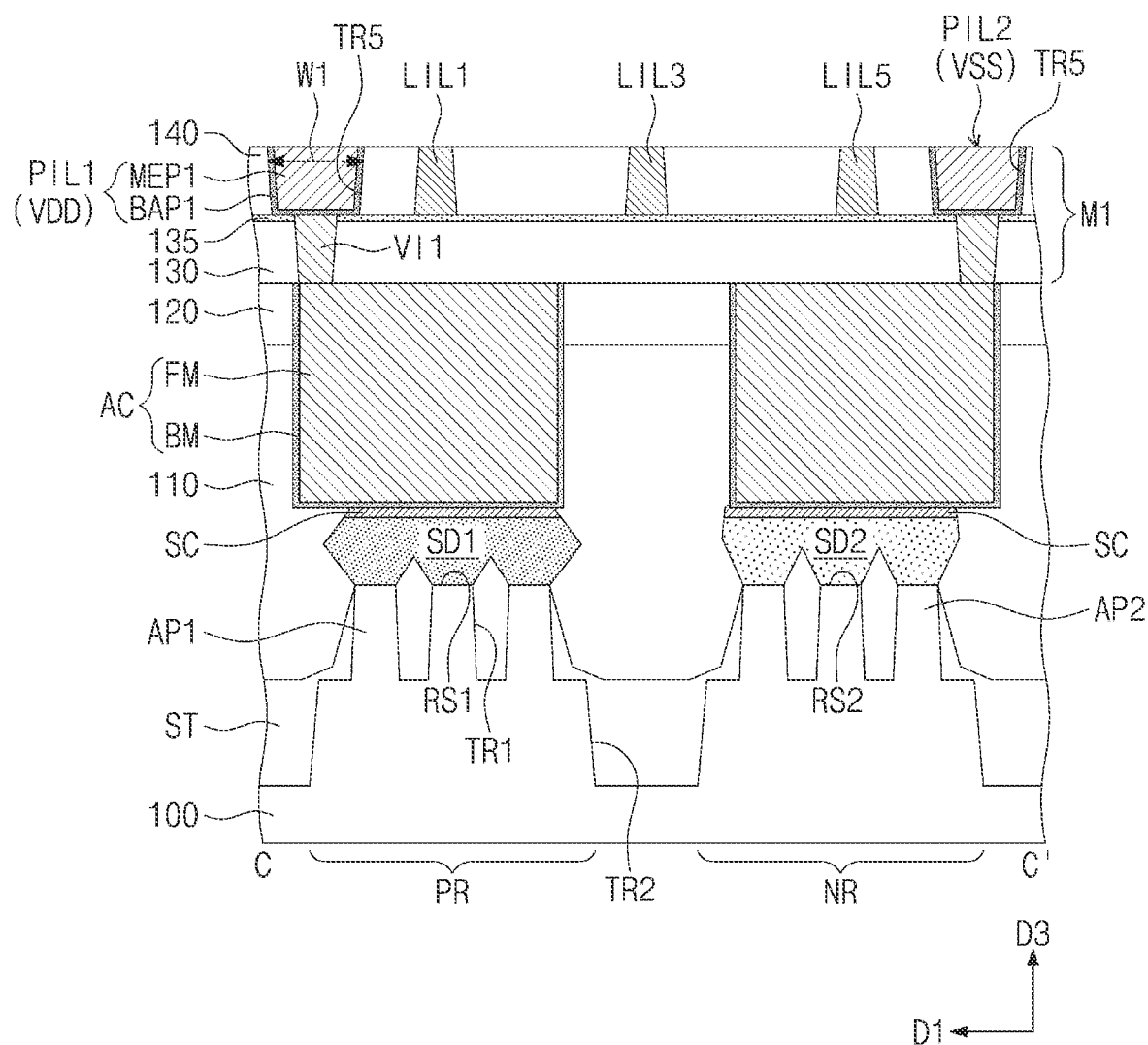
Figure 16B:
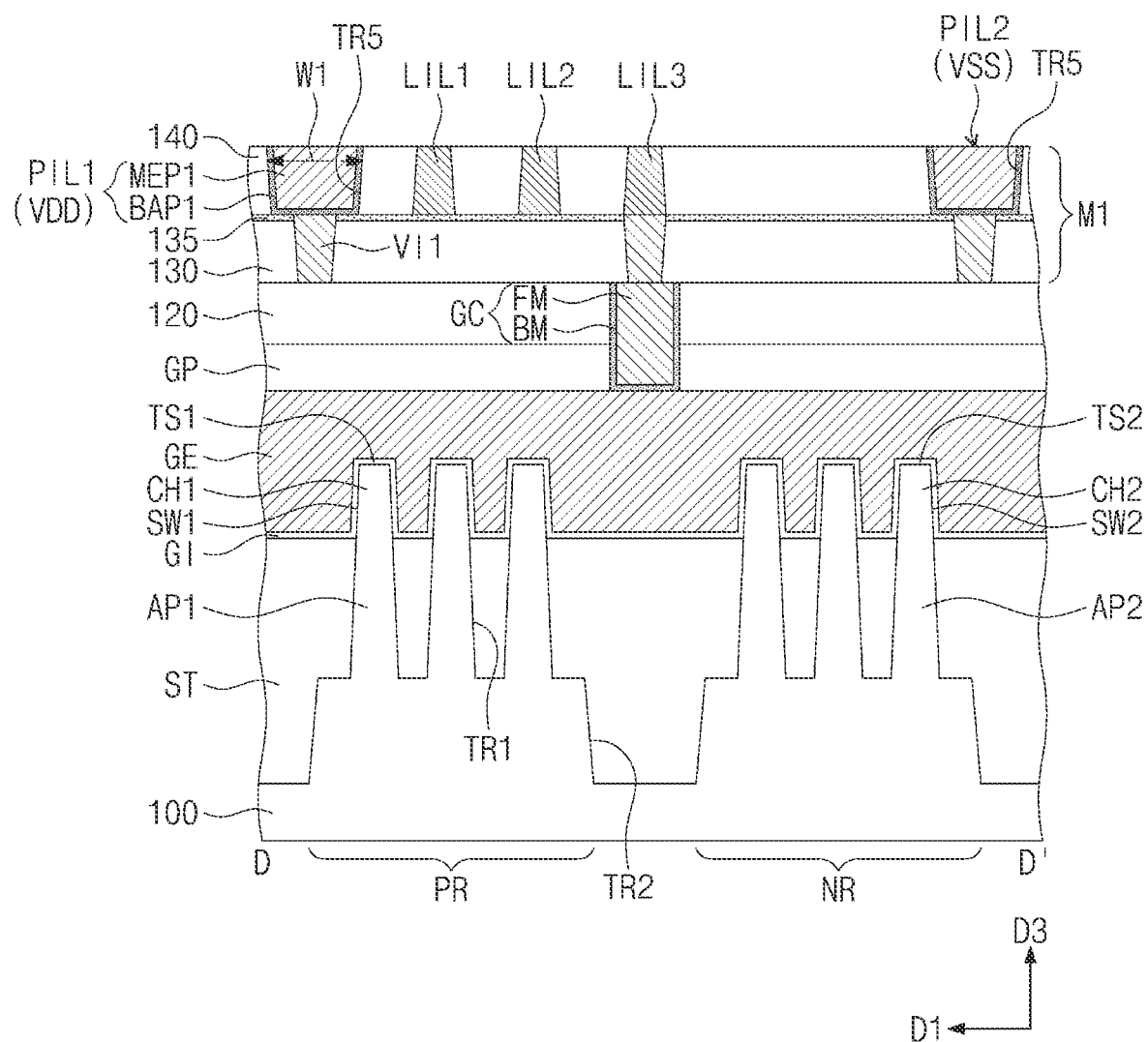
Figure 17A:
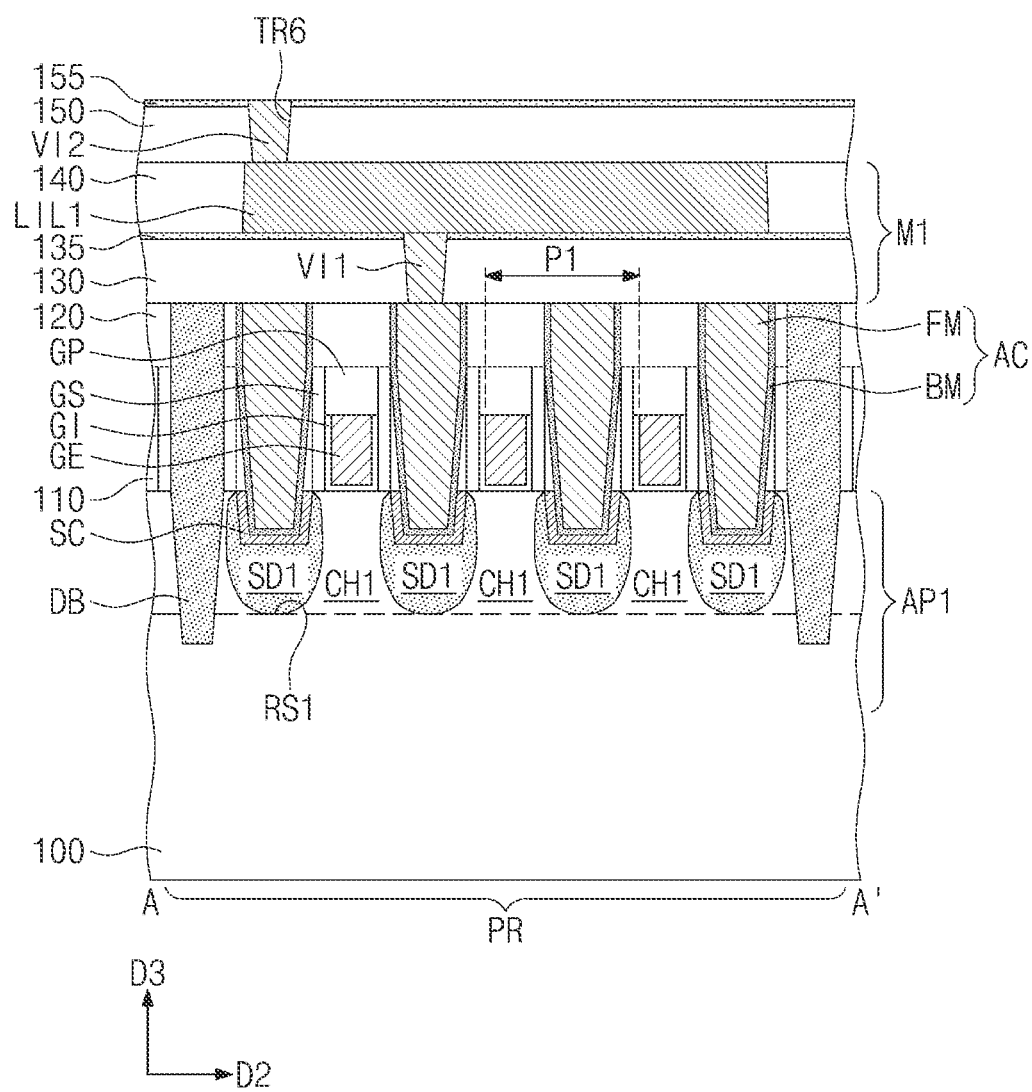
FIGS. 17A, 17B, 17C, and 17D illustrate cross-sectional views respectively taken along lines A-A', B-B', C-C', and D-D' of FIG. 15, showing a method of fabricating a semiconductor device according to some embodiments of the present inventive concepts.
Figure 17B:
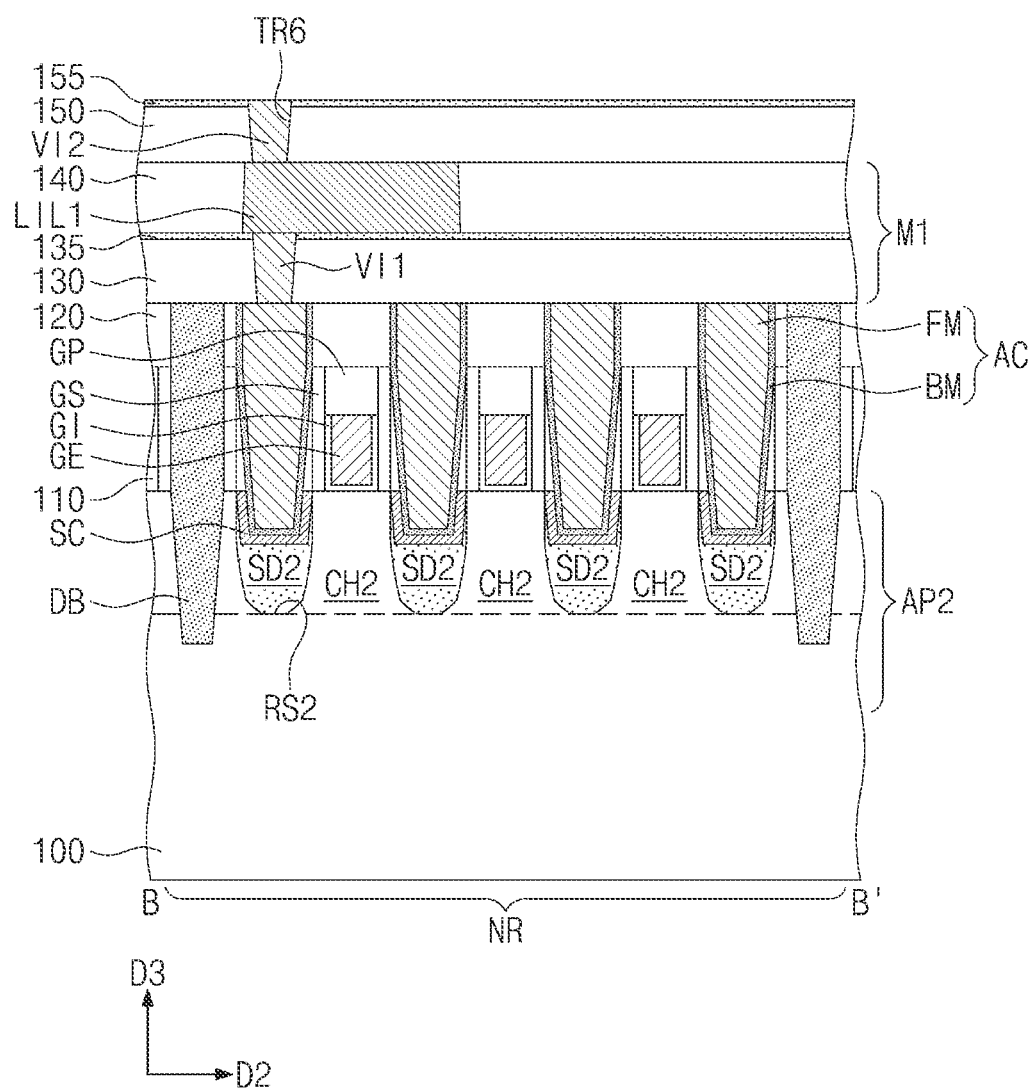
Figure 17C:
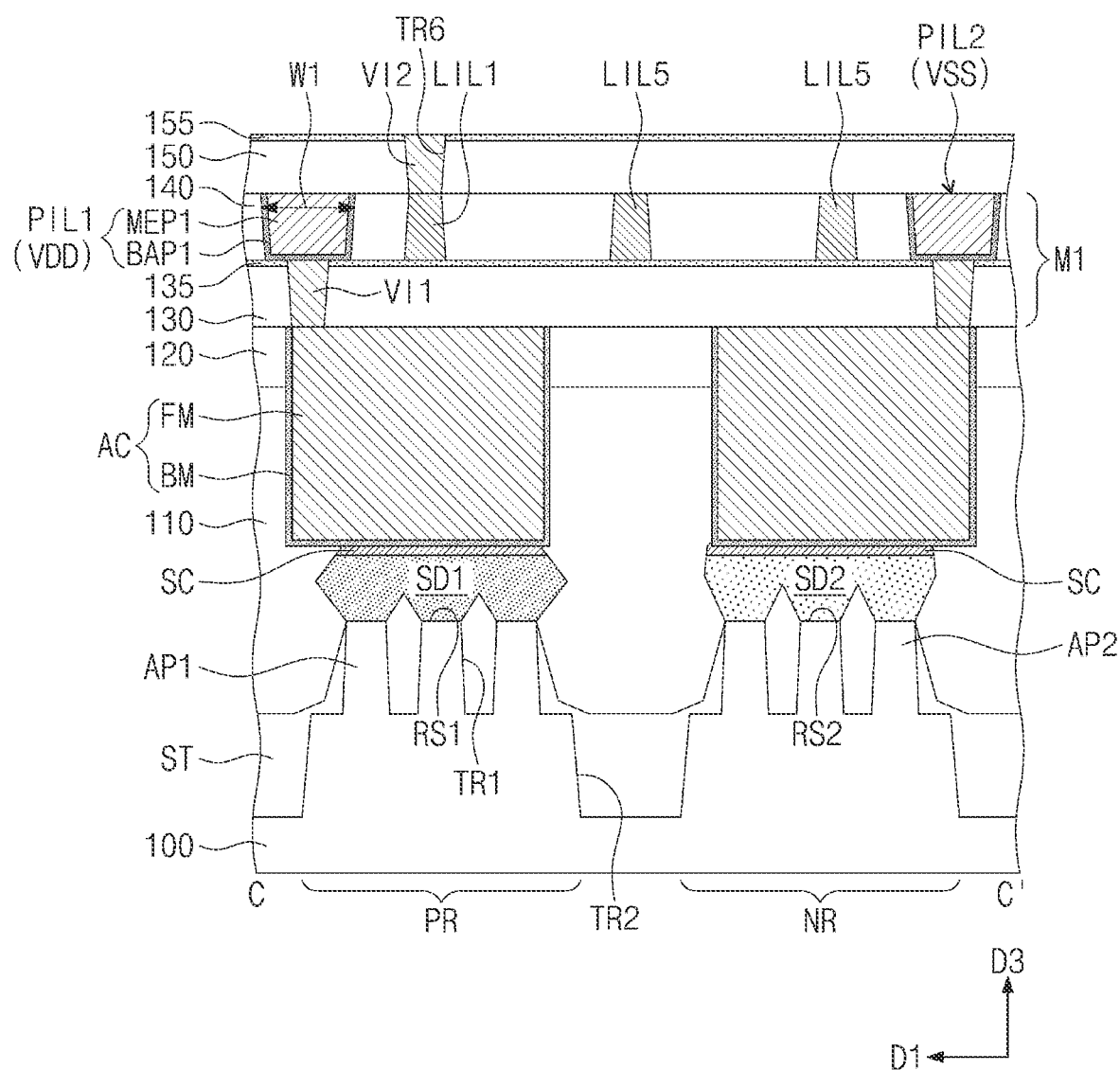
Figure 17D:
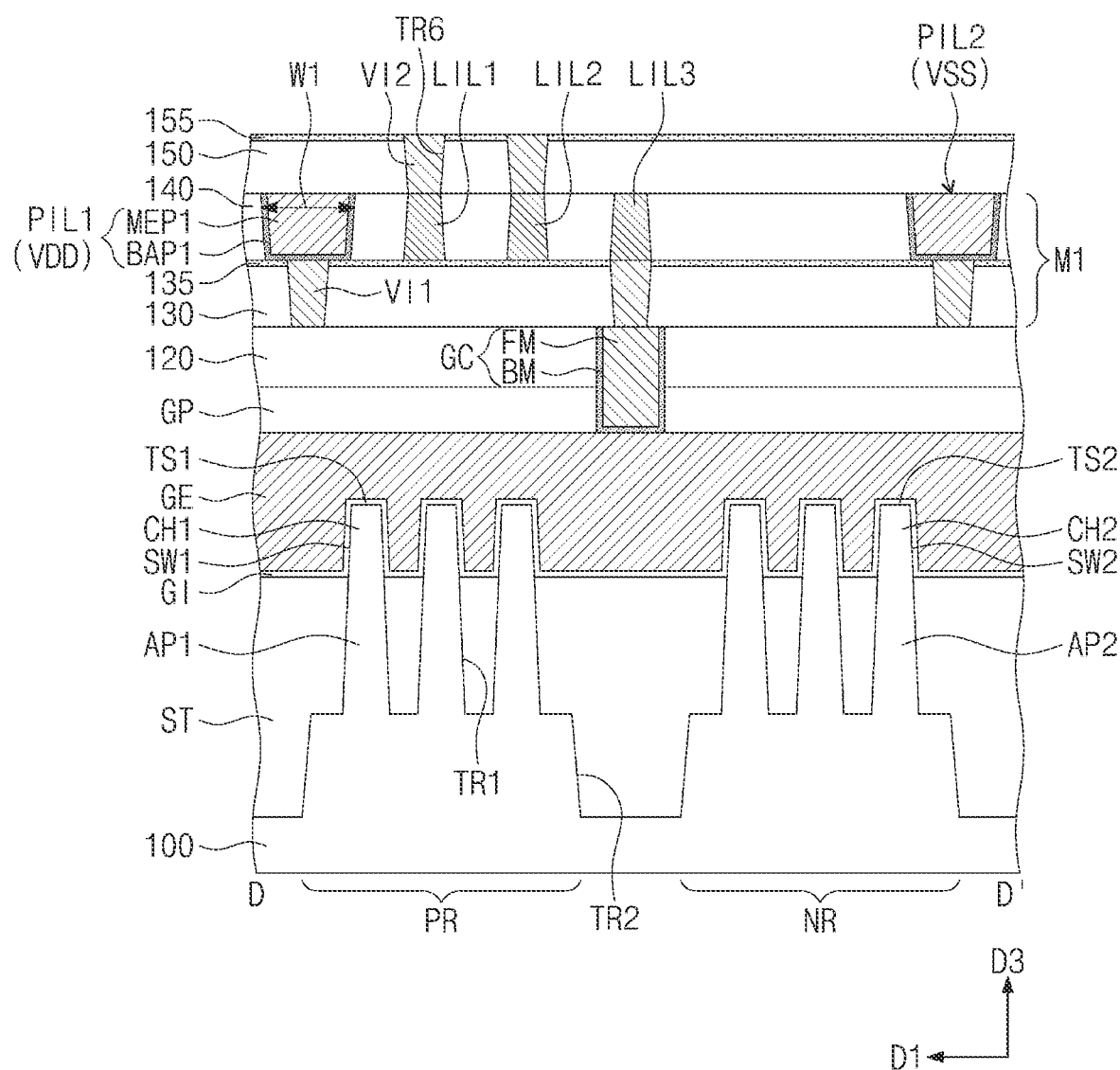

Referring to FIGS. 15, 16A, and 16B, first and second power lines PIL1 and PIL2 may be formed in the fourth interlayer dielectric layer 140. Each of the first and second power lines PIL1 and PIL2 may be formed by a damascene process. For example, the fourth interlayer dielectric layer 140 may be etched to form fifth trenches TR5. The fifth trenches TR5 may define positions of the first and second power lines PIL1 and PIL2. A first barrier metal pattern BAP1 may be formed on bottom surfaces and inner walls of the fifth trenches TR5. First metal patterns MEP1 may be formed on the first barrier metal pattern BAP1, filling the fifth trenches TR5. The fourth interlayer dielectric layer 140 may undergo a chemical mechanical polishing (CMP) process to form first and second power lines PIL1 and PIL2 provided in the fifth trenches TR5.

Referring to FIGS. 17A to 17D, a fifth interlayer dielectric layer 150 and second vias VI2 may be formed. The formation of the second vias VI2 may be the same as the formation of the first vias VI1. For example, the second vias VI2 may be formed by a single damascene process. A fifth interlayer dielectric layer 150 and a second etch stop layer 155 may be formed on the fourth interlayer dielectric layer 140. The second etch stop layer 155 may be patterned to define locations on which the second vias VI2 will be formed. The second etch stop layer 155 may be used as a mask to etch the fifth interlayer dielectric layer 150 to form sixth trenches TR6. The second etch stop layer 155 may undergo an atomic layer deposition (ALD) process or a chemical vapor deposition (CVD) process to form a third metallic material layer that fills the sixth trenches TR6 and covers or overlaps a top surface of the second etch stop layer 155. A chemical mechanical polishing (CMP) process may be performed on the third metallic material layer until the second etch stop layer 155 is exposed, which may form the second vias VI2 provided in the sixth trenches TR6.

Referring back to FIGS. 1 and 2A to 2D, first to third upper lines UIL1 to UIL3 and a sixth interlayer dielectric layer 160 may be formed. For example, the second etch stop layer 155 may undergo a physical vapor deposition (PVD) process to form a fourth metallic material layer. The fourth metallic material layer may cover or overlap the top surface of the second etch stop layer 155 and top surfaces of the second vias VI2 exposed by the second etch stop layer 155. Afterwards, the fourth metallic material layer may be etched to form seventh trenches TR7. Therefore, the first to third upper lines UIL1 to UIL3 may be formed. The seventh trenches TR7 may define the first to three upper lines UIL1 to UIL3. A dielectric material may be deposited on the seventh trenches TR7 to form a second dielectric layer that covers or overlaps insides of the seventh trenches TR7 and top surfaces of the first to third upper lines UIL1 to UIL3. A chemical mechanical polishing (CMP) process may be performed on the second dielectric layer until the top surfaces of the first to third lines UIL1 to UIL3 are exposed, which may form the sixth interlayer dielectric layer 160. The processes mentioned above may fabricate a semiconductor device according to some embodiments of the present inventive concepts.

FIGS. 18A, 18B, 18C, and 18D illustrate cross-sectional views respectively taken along lines A-A', B-B', C-C', and D-D' of FIG. 15, showing a semiconductor device according to some embodiments of the present inventive concepts. In the embodiments that follow, a detailed description of technical features repetitive to those discussed above with reference to FIGS. 1 and 2A to 2D will be omitted, and a difference thereof will be discussed in detail.

Referring to FIGS. 1 and 18A to 18D, a substrate 100 may be provided which includes a first active region PR and a second active region NR. A device isolation layer ST may be provided on the substrate 100. The device isolation layer ST may define a first active pattern AP1 and a second active pattern AP2 on an upper portion of the substrate 100. The first active pattern AP1 and the second active pattern AP2 may be respectively defined on the first active region PR and the second active region NR.

The first active pattern AP1 may include first channel patterns CH1 that are vertically stacked. The stacked first channel patterns CH1 may be spaced apart from each other in a third direction D3. The stacked first channel patterns CH1 may vertically overlap each other. The second active pattern AP2 may include second channel patterns CH2 that are vertically stacked. The stacked second channel patterns CH2 may be spaced apart from each other in the third direction D3. The stacked second channel patterns CH2 may vertically overlap each other. The first and second channel patterns CH1 and CH2 may include at least one selected from silicon (Si), germanium (Ge), and/or silicon-germanium (SiGe).

The first active pattern AP1 may further include first source/drain patterns SD1. The stacked first channel patterns CH1 may be interposed between a pair of neighboring first source/drain patterns SD1. The stacked first channel patterns CH1 may connect the pair of neighboring first source/drain patterns SD1 to each other.

The second active pattern AP2 may further include second source/drain patterns SD2. The stacked second channel patterns CH2 may be interposed between a pair of neighboring second source/drain patterns SD2. The stacked second channel patterns CH2 may connect the pair of neighboring second source/drain patterns SD2 to each other.

Gate electrodes GE may be provided to extend in a first direction D1, while crossing the first and second channel patterns CH1 and CH2. The gate electrode GE may vertically overlap the first and second channel patterns CH1 and CH2. A pair of gate spacers GS may be disposed on opposite sidewalls of the gate electrode GE. A gate capping pattern GP may be provided on the gate electrode GE.

Figure 18A:
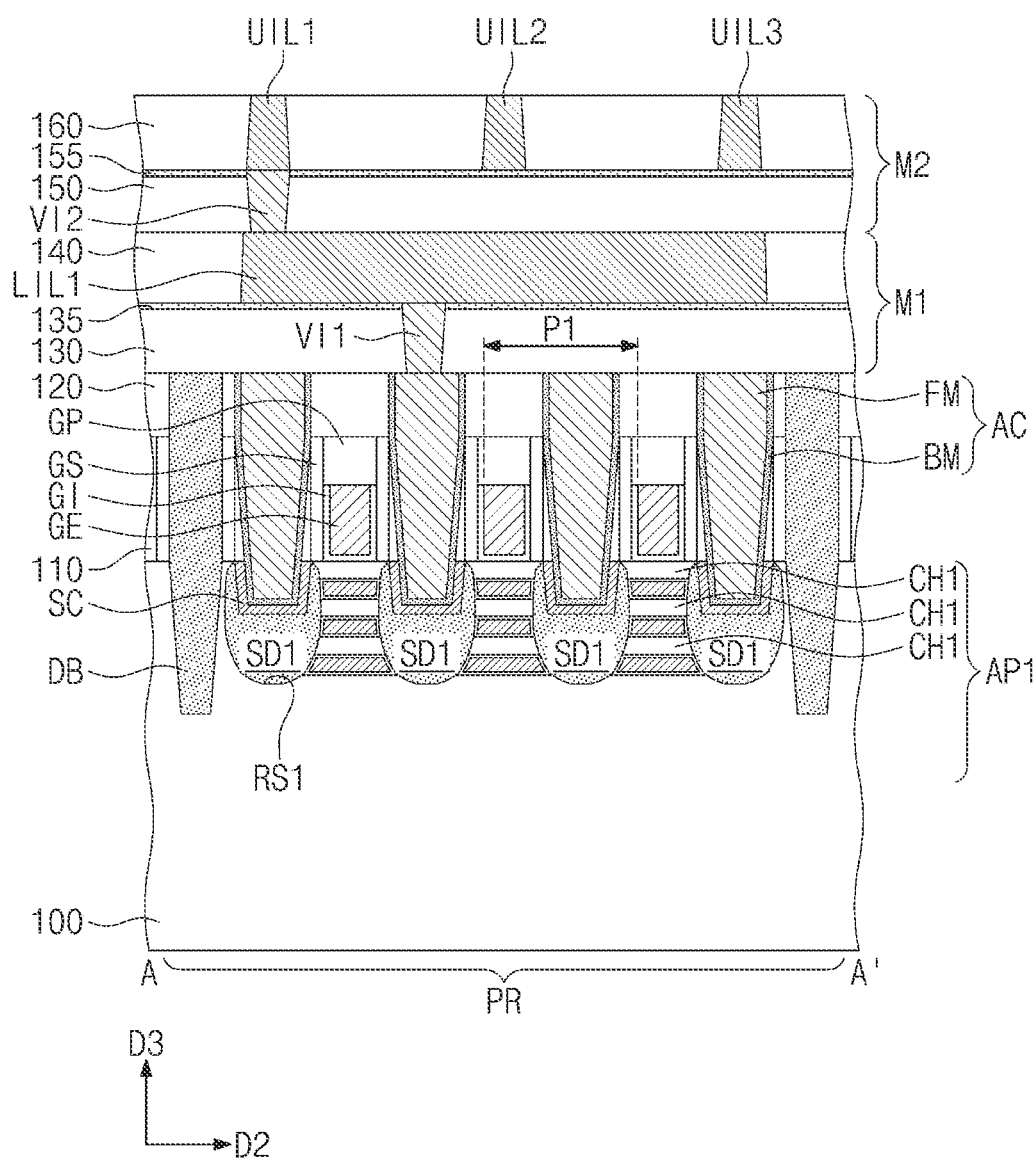
FIGS. 18A, 18B, 18C, and 18D illustrate cross-sectional views respectively taken along lines A-A', B-B', C-C', and D-D' of FIG. 15, showing a semiconductor device according to some embodiments of the present inventive concepts.
Figure 18B:
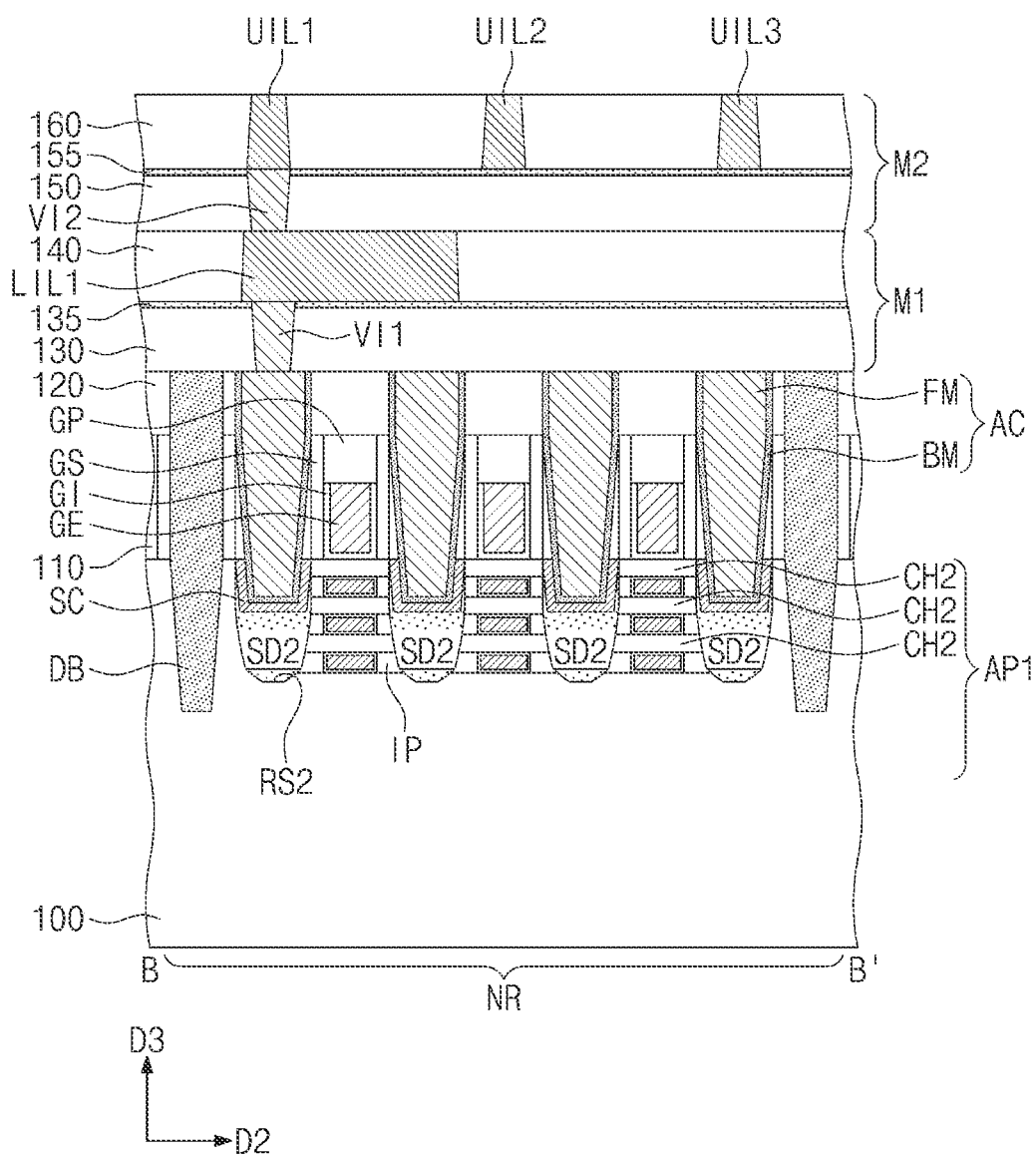
Figure 18C:
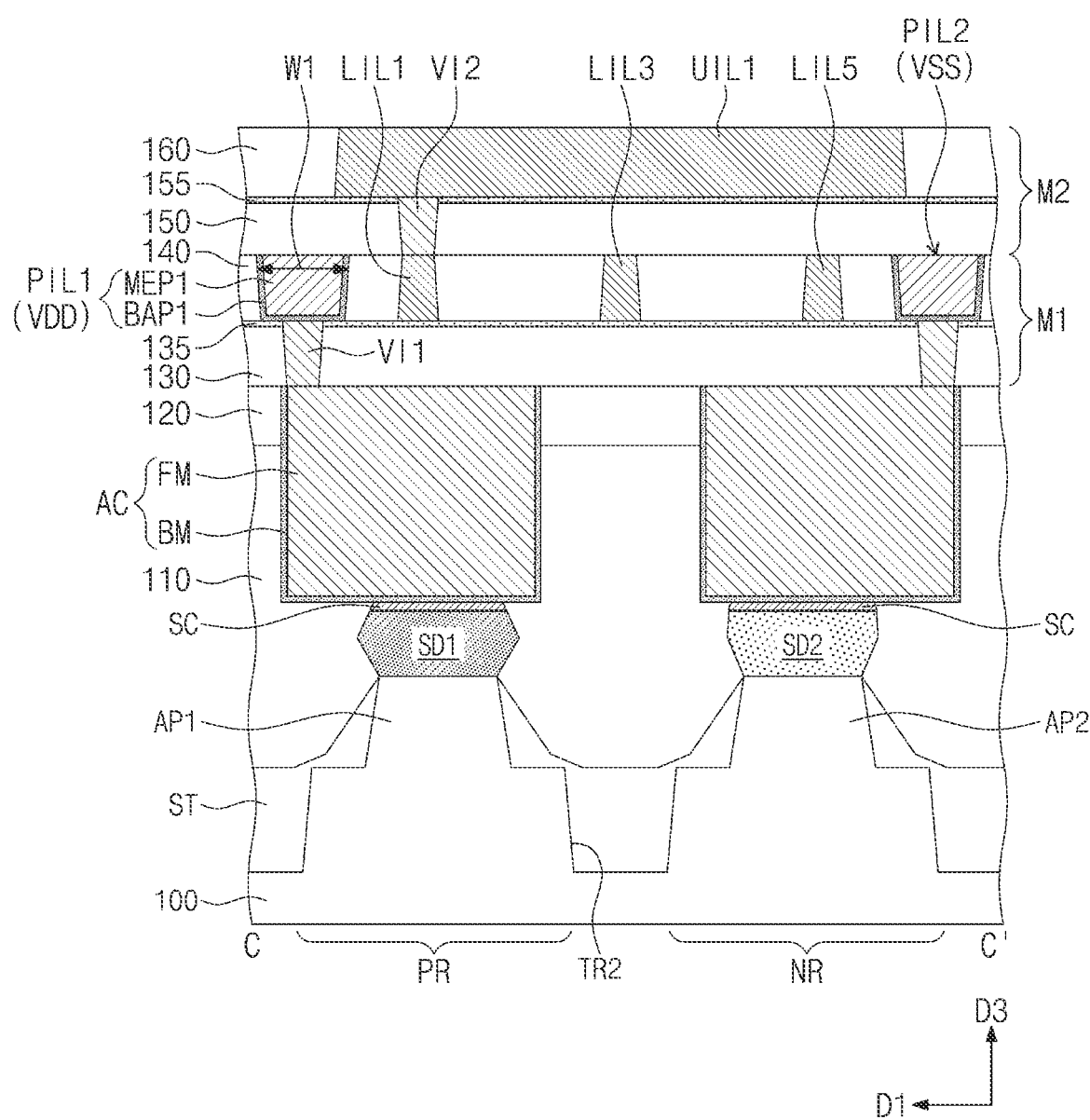
Figure 18D:
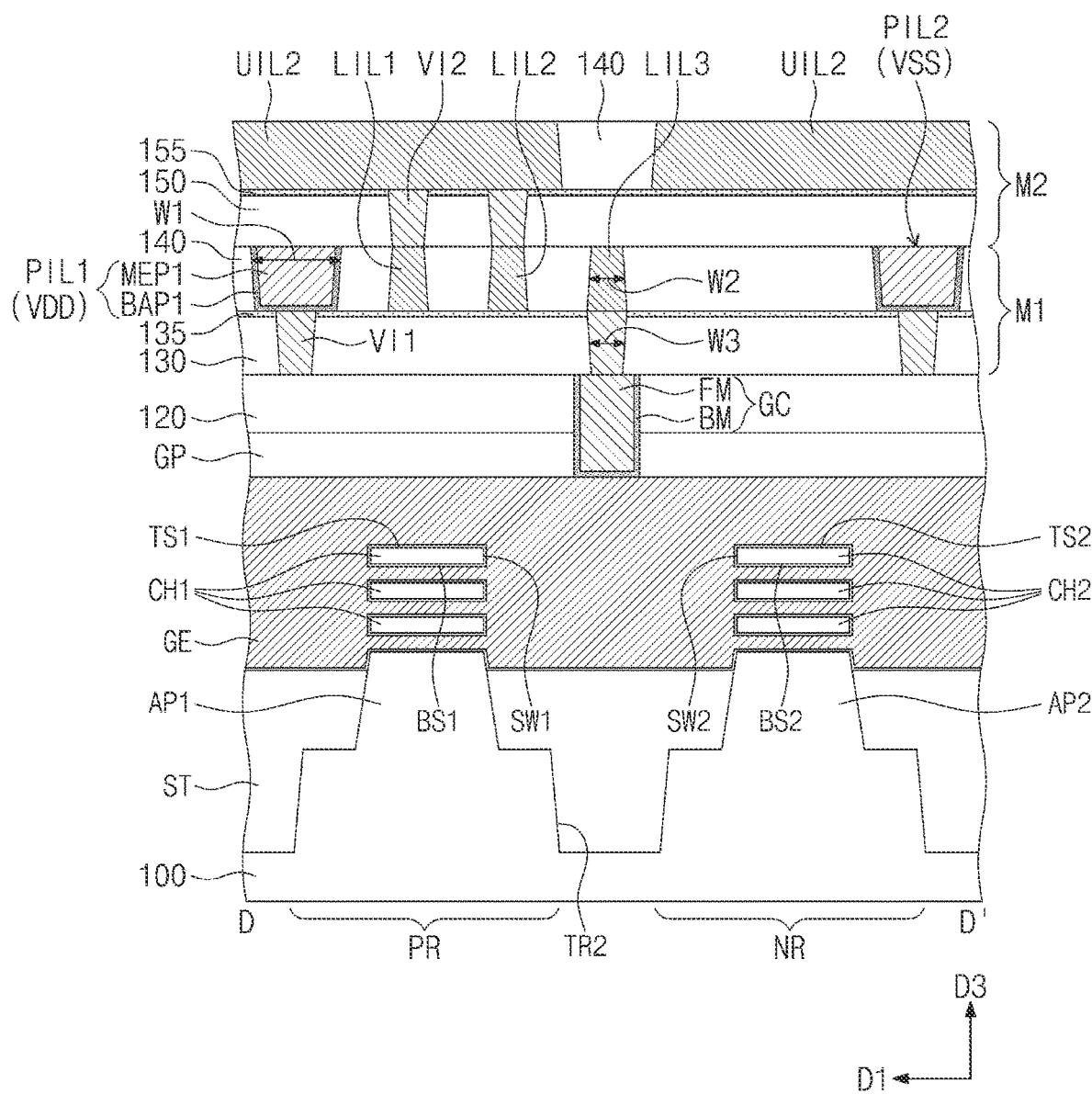

The gate electrode GE may surround each of the first and second channel patterns CH1 and CH2 (see FIG. 18D). The gate electrode GE may be provided on a first top surface TS1 of the first channel pattern CH1, at least one first sidewall SW1 of the first channel pattern CH1, and a first bottom surface BS1 of the first channel pattern CH1. The gate electrode GE may be provided on a second top surface TS2 of the second channel pattern CH2, at least one second sidewall SW2 of the second channel pattern CH2, and a second bottom surface BS2 of the second channel pattern CH2. For example, the gate electrode GE may surround a top surface, a bottom surface, and opposite sidewalls of each of the first and second channel patterns CH1 and CH2. A transistor according to some embodiments may be a three-dimensional field effect transistor (e.g. MBCFET) in which the gate electrode GE three-dimensionally surrounds the first and second channel patterns CH1 and CH2.

A gate dielectric layer GI may be provided between the gate electrode GE and each of the first and second channel patterns CH1 and CH2. The gate dielectric layer GI may surround each of the first and second channel patterns CH1 and CH2.

On the second active region NR, a dielectric pattern IP may be interposed between the gate dielectric layer GI and the second source/drain pattern SD2. The gate dielectric layer GI and the dielectric pattern IP may separate the gate electrode GE from the second source/drain pattern SD2. In contrast, the dielectric pattern IP may be omitted from the first active region PR.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to correspondingly have connection with the first and second source/drain patterns SD1 and SD2. A gate contact GC may be provided to penetrate the second interlayer dielectric layer 120 and the gate capping pattern GP and to have connection with the gate electrode GE.

A first wiring layer M1 may be provided on the second interlayer dielectric layer 120. A second wiring layer M2 may be provided on the first wiring layer M1. Detailed descriptions of the first wiring layer M1 and the second wiring layer M2 may be substantially the same as those discussed above with reference to FIGS. 1, 2A to 2D, and 3.

A semiconductor device according to the present inventive concepts may include a wiring layer including vias and wiring lines. The vias and the wiring lines may include different metallic materials from each other. Accordingly, the semiconductor device may improve in electrical characteristics.

Although some embodiments of the present inventive concepts have been discussed with reference to accompanying figures, it will be understood that various changes in form and details may be made therein without departing from the spirit and scope of the present inventive concepts. It therefore will be understood that the embodiments described above are illustrative but not limitative in all aspects.

What is claimed is:

1. A semiconductor device, comprising:
a substrate;
a first interlayer dielectric layer on the substrate;
a plurality of first vias in the first interlayer dielectric layer;
a second interlayer dielectric layer on the first interlayer dielectric layer; and
a first power line and a first lower line in the second interlayer dielectric layer that are electrically connected to respective ones of the first vias,
wherein a first width in a first direction of the first power line is greater than a second width in the first direction of the first lower line,
wherein the first power line comprises a first metallic material,
wherein the first lower line comprises a second metallic material,
wherein the first vias comprise a third metallic material, and
wherein the first, second, and third metallic materials are different from each other.

2. The semiconductor device of claim 1, wherein the first power line comprises:
a first barrier metal pattern in contact with the second interlayer dielectric layer; and
a first metal pattern on the first barrier metal pattern.

3. The semiconductor device of claim 1,
wherein the first metallic material comprises copper,
wherein the second metallic material comprises molybdenum or ruthenium, and
wherein the third metallic material comprises another of molybdenum or ruthenium.

4. The semiconductor device of claim 1, further comprising:
a first etch stop layer between the first interlayer dielectric layer and the second interlayer dielectric layer, wherein the first etch stop layer is on a top surface of the first interlayer dielectric layer but not on top surfaces of the first vias.

5. The semiconductor device of claim 1, wherein the second width is in a range of about 1 nm to about 20 nm.

6. The semiconductor device of claim 1,
wherein the first width of the first power line increases with decreasing distance from a top surface of the second interlayer dielectric layer, and
wherein the second width of the first lower line decreases with decreasing distance from the top surface of the second interlayer dielectric layer.

7. The semiconductor device of claim 6, wherein a third width in the first direction of ones of the first vias increases with decreasing distance from a top surface of the first interlayer dielectric layer.

8. The semiconductor device of claim 1, wherein the substrate comprises an active region, the semiconductor device further comprising:
first source/drain patterns on the active region,
wherein respective lattice constants of the first source/drain patterns are greater than a lattice constant of the substrate such that the first source/drain patterns exert a compressive stress on a channel pattern that is between the first source/drain patterns.

9. The semiconductor device of claim 1, wherein lateral surfaces of the first lower line are in direct contact with the second interlayer dielectric layer.

10. The semiconductor device of claim 1, wherein a width in the first direction of a bottom surface of the first lower line is equal to a width in the first direction at a top surface of a corresponding one of the first vias.

11. A semiconductor device, comprising:
a substrate;
a first interlayer dielectric layer on the substrate;
a plurality of first vias in the first interlayer dielectric layer;
a second interlayer dielectric layer on the first interlayer dielectric layer; and
a first power line and a first lower line in the second interlayer dielectric layer that are electrically connected to respective ones of the first vias,
wherein a width at a top surface of the first power line is greater than a width at a bottom surface of the first power line,
wherein a width at a top surface of the first lower line is less than a width at a bottom surface of the first lower line,
wherein the first power line comprises a first metallic material,
wherein the first lower line comprises a second metallic material,
wherein the first vias comprise a third metallic material, and
wherein the first, second, and third metallic materials are different from each other.

12. The semiconductor device of claim 11, further comprising:
a third interlayer dielectric layer on the second interlayer dielectric layer; and
a second via in the third interlayer dielectric layer and electrically connected to the first lower line,
wherein the second via comprises the third metallic material, and
wherein a width in the first direction of the second via increases with decreasing distance from a top surface of the third interlayer dielectric layer.

13. The semiconductor device of claim 11, wherein a width in the first direction of the first power line is in a range of about 20 nm to about 100 nm.

14. The semiconductor device of claim 11,
wherein a lateral surface of each of the first vias is in direct contact with the first interlayer dielectric layer, and
wherein a lateral surface of the first lower line is in direct contact with the second interlayer dielectric layer.

15. The semiconductor device of claim 11, wherein opposing lateral surfaces of the first lower line taper toward a top surface of the second interlayer dielectric layer.

16. The semiconductor device of claim 11, wherein a width at a top surface of each of the first vias is greater than a width at a bottom surface of each of the first vias.

17. A semiconductor device, comprising:
a substrate comprising an active region;
a device isolation layer that defines a plurality of active patterns on the active region, wherein the device isolation layer is on a lower sidewall of each of the active patterns, and wherein an upper portion of each of the active patterns protrudes upward from the device isolation layer;
a pair of source/drain patterns on an upper portion of each of the active patterns;
a channel pattern between the pair of source/drain patterns;
a gate electrode on the channel pattern and extends in a first direction;
a gate spacer on a side of the gate electrode, the gate spacer extending in the first direction along the gate electrode;
a gate dielectric layer between the gate electrode and the channel pattern and between the gate electrode and the gate spacer;
a gate capping pattern on a top surface of the gate electrode, the gate capping pattern extending in the first direction along the gate electrode;
a first interlayer dielectric layer on the gate capping pattern;
an active contact that penetrates the first interlayer dielectric layer and has electrical connection with at least one source/drain pattern;
a second interlayer dielectric layer on the first interlayer dielectric layer;
a plurality of first vias in the second interlayer dielectric layer;
a first etch stop layer on the second interlayer dielectric layer;
a third interlayer dielectric layer on the first etch stop layer; and
a first power line and a first lower line in the third interlayer dielectric layer that are electrically connected to corresponding ones of the first vias,
wherein a first width in the first direction of the first power line is greater than a second width in the first direction of the first lower line,
wherein the first power line comprises a first metallic material,
wherein the first lower line comprises a second metallic material,
wherein the first vias comprise a third metallic material, and
wherein the first, second, and third metallic materials are different from each other.

18. The semiconductor device of claim 17, wherein the first power line comprises:

a first barrier metal pattern in contact with the second interlayer dielectric layer; and a first metal pattern on the first barrier metal pattern, wherein a lateral surface of the first lower line is in direct contact with the third interlayer dielectric layer.

19. The semiconductor device of claim 17, further comprising:

a fourth interlayer dielectric layer on the third interlayer dielectric layer;

a second via in the fourth interlayer dielectric layer that is electrically connected to the first lower line;

a fifth interlayer dielectric layer on the fourth interlayer dielectric layer; and an upper line in the fifth interlayer dielectric layer, wherein a width in the first direction of the second via increases with decreasing distance from a top surface of the fourth interlayer dielectric layer, and wherein a width in the first direction of the upper line decreases with decreasing distance from a top surface of the fifth interlayer dielectric layer.

* * * * *